US012802612B2

(12) United States Patent
Zhang

(10) Patent No.: US 12,802,612 B2
(45) Date of Patent: Nov. 17, 2026

(54) GATE DRIVING CIRCUIT WITH STABLE POTENTIAL AT CONTROL NODE IN LOW POWER CONSUMPTION MODE AND DISPLAY PANEL WITH THE SAME

(71) Applicant: WUHAN CHINA STAR OPTOELECTRONICS SEMICONDUCTOR DISPLAY TECHNOLOGY CO., LTD., Wuhan (CN)

(72) Inventor: Huanxi Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 19/060,540

(22) Filed: Feb. 21, 2025

(65) Prior Publication Data

US 2025/0191520 A1 Jun. 12, 2025

Related U.S. Application Data

(63) Continuation of application No. 18/522,326, filed on Nov. 29, 2023, now Pat. No. 12,272,291, which is a
(Continued)

(30) Foreign Application Priority Data

Oct. 8, 2023 (CN) ......................... 202311300460.1

(51) Int. Cl.
*G09G 3/20* (2006.01)
*G09G 3/32* (2016.01)
(Continued)

(52) U.S. Cl.
CPC ............. *G09G 3/2092* (2013.01); *G09G 3/20* (2013.01); *G09G 3/32* (2013.01); *G09G 3/3266* (2013.01);
(Continued)

(58) Field of Classification Search
CPC ...... G09G 3/2092; G09G 3/32; G09G 3/3266; G09G 3/3677; G09G 2230/00;
(Continued)

(56) References Cited

U.S. PATENT DOCUMENTS 10,614,737 B1 4/2020 Li
12,272,291 B1 * 4/2025 Zhang .................. G09G 3/2092
(Continued)

FOREIGN PATENT DOCUMENTS

CN 105719599 A 6/2016
CN 107644622 A 1/2018
(Continued)

OTHER PUBLICATIONS

International Search Report in International application No. PCT/CN2023/128882, mailed on Dec. 11, 2023.
(Continued)

*Primary Examiner* — Adam J Snyder
(74) *Attorney, Agent, or Firm* — PV IP PC; Christopher S. Ruprecht; Wei Te Chung

(57) ABSTRACT

A gate driving circuit includes an input subcircuit, an output subcircuit and a voltage stabilizing subcircuit. The input subcircuit is configured to receive a start control signal and control a voltage of a second node. The output subcircuit is configured to output a gate driving signal according to a potential of the second node. The voltage stabilizing subcircuit is electrically connected to a first power line, a second power line and the second node, and is configured to transmit a voltage on the first power line or a voltage on the
(Continued)

second power line to the second node in a low power consumption mode of the gate driving circuit.

20 Claims, 19 Drawing Sheets

Related U.S. Application Data continuation of application No. PCT/CN2023/128882, filed on Oct. 31, 2023.

(51) Int. Cl.
*G09G 3/3266* (2016.01)
*G09G 3/36* (2006.01)
*H10D 30/67* (2025.01)

(52) U.S. Cl.
CPC ....... *G09G 3/3677* (2013.01); *G09G 2230/00* (2013.01); *G09G 2300/0426* (2013.01); *G09G 2310/0267* (2013.01); *G09G 2310/08* (2013.01); *G09G 2330/021* (2013.01); *G09G 2330/022* (2013.01); *H10D 30/6755* (2025.01)

(58) Field of Classification Search
CPC ... G09G 2300/0426; G09G 2310/0267; G09G 2310/08; G09G 2330/021; G09G 2330/022; G09G 3/20; H10D 30/6755
See application file for complete search history.

(56) References Cited

U.S. PATENT DOCUMENTS

| | | | | |
|---|---|---|---|---|
| 2015/0042638 | A1 | 2/2015 | Kwon et al. | |
| 2019/0035322 | A1* | 1/2019 | Kim | H10D 86/60 |
| 2021/0335301 | A1 | 10/2021 | Liang | |
| 2021/0358367 | A1 | 11/2021 | Zheng | |
| 2021/0407432 | A1* | 12/2021 | Wei | G09G 3/3266 |
| 2022/0051608 | A1* | 2/2022 | Shang | G09G 3/2092 |
| 2022/0165218 | A1 | 5/2022 | Cho et al. | |
| 2022/0198975 | A1 | 6/2022 | Cao | |
| 2022/0343855 | A1* | 10/2022 | Shang | G09G 3/3266 |
| 2022/0392403 | A1* | 12/2022 | Yamamoto | G11C 19/28 |
| 2023/0326411 | A1* | 10/2023 | In | G09G 3/3266 |
| 2024/0282266 | A1* | 8/2024 | Liu | G09G 3/3266 |
| 2024/0355403 | A1* | 10/2024 | Wei | G09G 3/3266 |
| 2024/0371329 | A1* | 11/2024 | Liu | G09G 3/3266 |
| 2024/0379063 | A1* | 11/2024 | Xu | G09G 3/3266 |

FOREIGN PATENT DOCUMENTS

| | | | | | |
|---|---|---|---|---|---|
| CN | 107978276 | A | | 5/2018 | |
| CN | 210956110 | U | | 7/2020 | |
| CN | 111681625 | A | | 9/2020 | |
| CN | 113284451 | A | | 8/2021 | |
| CN | 113793573 | A | | 12/2021 | |
| CN | 115578965 | A | * | 1/2023 | G09G 3/20 |
| CN | 115862541 | A | | 3/2023 | |
| JP | 2013066172 | A | | 4/2013 | |
| KR | 20200004395 | A | | 1/2020 | |
| WO | 2022241843 | A1 | | 11/2022 | |
| WO | 2023159609 | A1 | | 8/2023 | |
| WO | 2023173259 | A1 | | 9/2023 | |

OTHER PUBLICATIONS

Written Opinion of the International Search Authority in International application No. PCT/CN2023/128882, mailed on Dec. 11, 2023.
German Office Action issued in corresponding German Patent Application No. 11 2023 000 089.1 dated Jun. 17, 2024 pp. 1-7.
Korean Office Action issued in corresponding Korean Patent Application No. 10-2023-7041304 dated Jul. 27, 2024, pp. 1-3.
Japanese Office Action issued in corresponding Japanese Patent Application No. 特願 2023-574308 dated Dec. 9, 2025, pp. 1-5.
Korean Office Action issued in corresponding Korean Patent Application No. 10-2025-7021196 dated Apr. 29, 2026, pp. 1-9.
Indian Office Action issued in corresponding Indian Patent Application No. 202317080854 dated May 26, 2026, pp. 1-7.

* cited by examiner

GATE DRIVING CIRCUIT WITH STABLE POTENTIAL AT CONTROL NODE IN LOW POWER CONSUMPTION MODE AND DISPLAY PANEL WITH THE SAME

CROSS REFERENCE TO RELATED APPLICATIONS

This application is a continuation of U.S. patent application Ser. No. 18/522,326, filed on Nov. 29, 2023, which is a continuation of International Application No. PCT/CN2023/128882, filed on Oct. 31, 2023, which claims priority to Chinese Patent Application No. 202311300460.1, filed on Oct. 8, 2023. The disclosures of the abovementioned applications are incorporated herein by reference in their entireties.

TECHNICAL FIELD

The present application relates to the field of display technology, more specifically to a gate driving circuit and a display panel.

BACKGROUND

In display panels, gate driving circuits are usually used to provide corresponding gate driving signals for different transistors. The gate driving signal includes a plurality of stage circuits, and each stage circuit outputs a gate driving signal of a corresponding stage.

In the related art, in order to reduce a power consumption of the stage circuit, an operation mode of a gate circuit includes a normal mode and a low power consumption mode. In the low power consumption mode, frequencies of multiple input signals of the stage circuit are reduced compared to the normal mode. For example, reduce frequencies of a start signal (STV) and a clock signal (CK). However, reducing the frequency of the clock signal may cause a control node used for an output of a control stage circuit to be in a floating state. This further causes a voltage of a control node to leak, causing abnormalities in a display panel.

SUMMARY

According to some embodiments of the present application, a gate driving circuit includes an input subcircuit configured to receive a start control signal and control a voltage of a second node; an output subcircuit configured to output a gate driving signal according to a potential of the second node; and a voltage stabilizing subcircuit electrically connected to a first power line, a second power line and the second node, and configured to transmit a voltage on the first power line or a voltage on the second power line to the second node in a low power consumption mode of the gate driving circuit.

According to some embodiments of the present application, a display panel includes the above gate driving circuit.

DETAILED DESCRIPTION

It should be understood that embodiments described here are only used to explain the present application and are not used to limit the present application.

Figure 1:
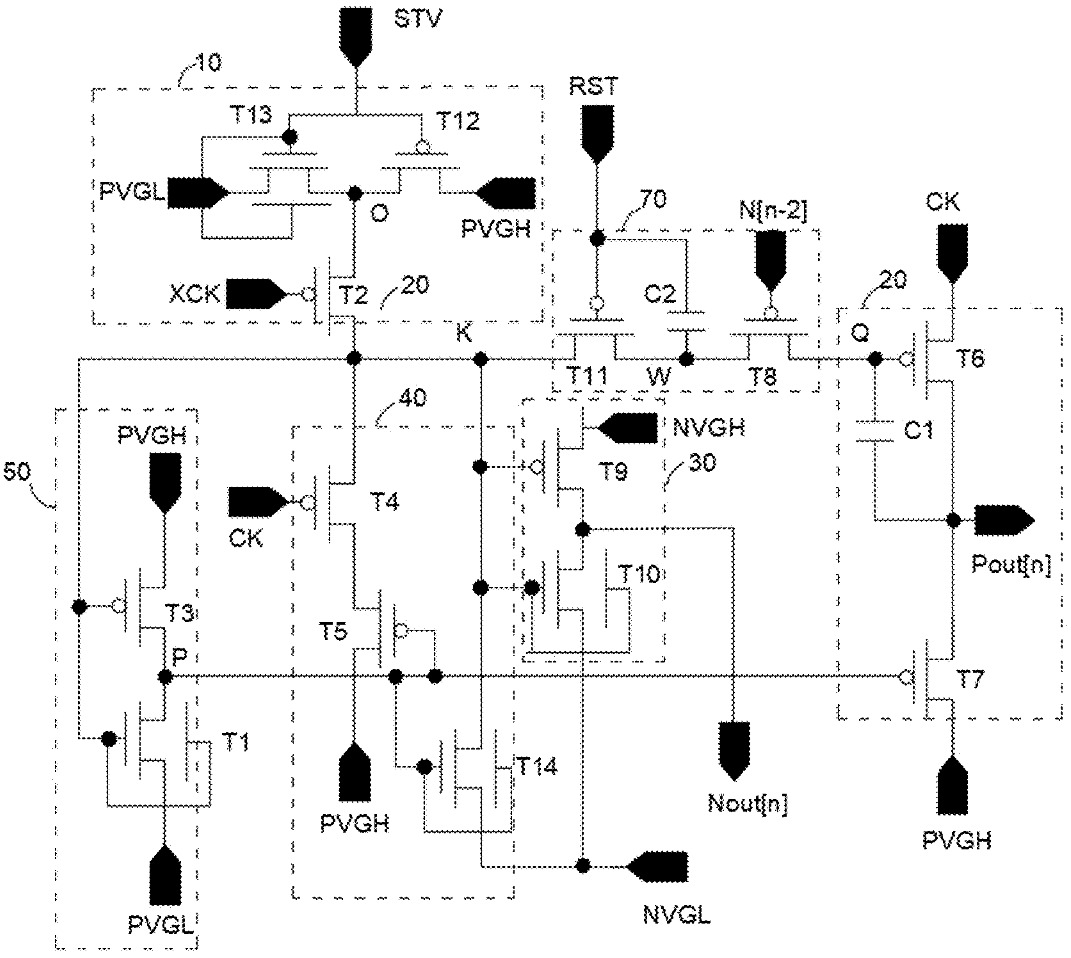
FIG. 1 is a schematic structural diagram of a gate driving circuit in the related art.
Figure 2:
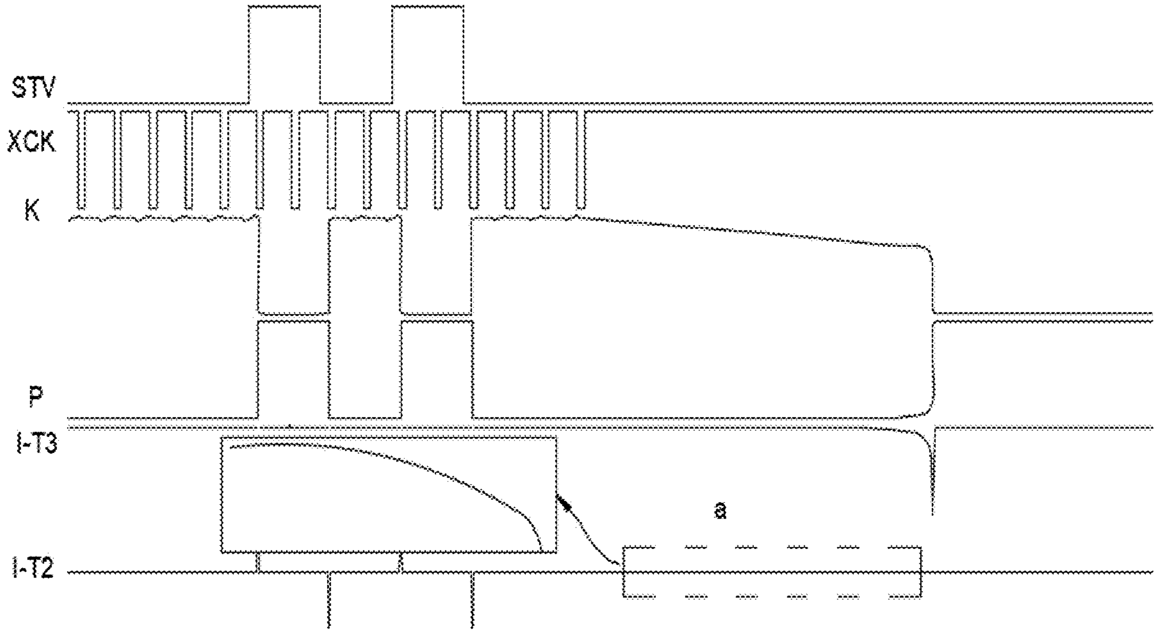
FIG. 2 is a timing diagram of some signals in the gate driving circuit shown in FIG. 1.

Refer to FIGS. 1 and 2, FIG. 1 is a schematic structural diagram of a gate driving circuit in the related art. The gate driving circuit includes at least one of an input module 10, a second driving control module 70, a first driving control module 50, a first output module 20, a second output module 30, and a voltage stabilizing module 40.

The first output module 20 outputs a first gate driving signal. The second output module 30 outputs a second gate driving signal. For detailed description of the gate driving circuit, refer to the following related descriptions.

In order to reduce the power consumption of the stage circuit, in the low power consumption mode, frequencies of multiple input signals of the stage circuit are reduced. For example, reduce frequencies of a start signal (STV) and clock signals (CK, XCK).

However, during the application process, the inventor found that the reduction in the frequency of the clock signal may cause abnormal display of the display panel. As shown in a of FIG. 2, when the clock signal is in a high potential state for a long time, a transistor T2 and a first transistor T4 are all in an off state, and a second node K is in a floating state. However, due to a leakage current of the transistor T2, a potential of the second node K cannot be maintained for a long time, causing the second node K to leak through the transistor T2, and the potential of the second node K continues to decrease. When the potential of the second node K decreases to a certain potential, Vgs of a fifth transistor T3 becomes smaller and smaller, and finally reaches a critical value for turning on the fifth transistor T3. When the fifth transistor T3 is turned on, point P is at a high potential, and a third transistor T14 is turned on, pulling the potential of the second node K down to a low potential. Eventually, a transistor T9 is turned on and outputs a second gate driving signal, resulting in abnormal output.

That is to say, when a clock signal frequency is reduced in the gate driving circuit shown in FIG. 1, the above-mentioned specific issue may be caused. That is, when the frequency of the clock signal is reduced, the output of the stage circuit may be abnormal, causing display issues on the display panel.

Figure 3:
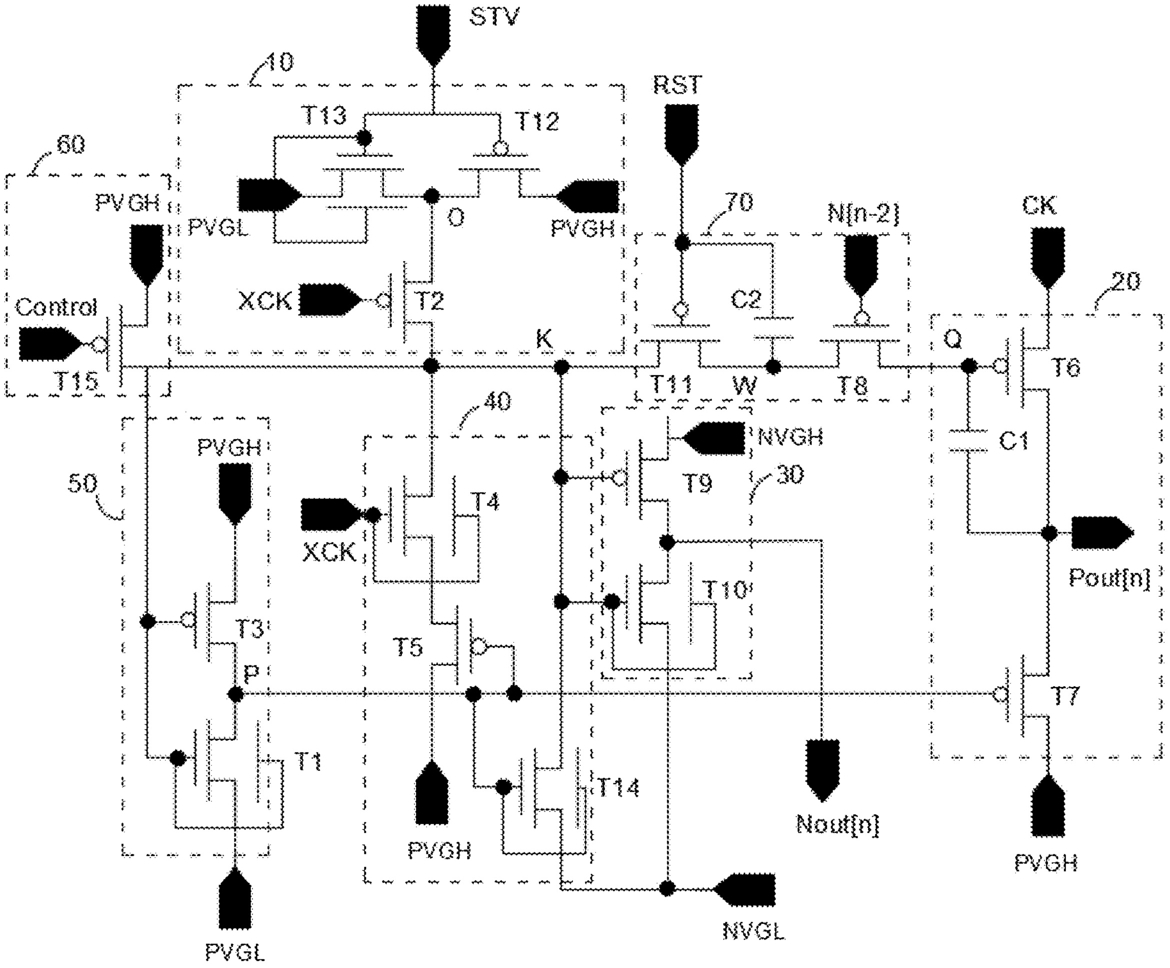
FIG. 3 is a schematic structural diagram of a gate driving circuit provided by an embodiment of the present application.
Figure 4:
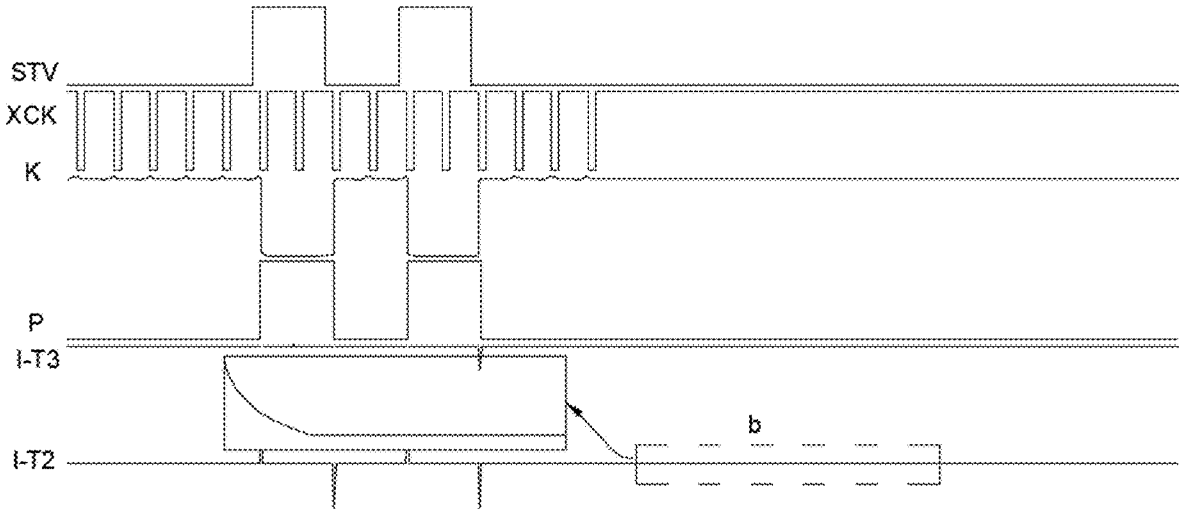
FIG. 4 is a timing diagram of some signals in the gate driving circuit shown in FIG. 3.

In view of this, this embodiment provides a gate driving circuit. Referring to FIG. 1 to FIG. 22, as shown in FIG. 3, the gate driving circuit includes multiple stage circuits. The stage circuit includes at least one of an input module 10, a first output module 20, a second output module 30, a first driving control module 50, and a voltage stabilizing module 40.

The input module 10 receives a start signal or a stage transmission signal output by other stage circuits, and controls a voltage of the second node K. The first output module 20 outputs a first gate driving signal according to a potential of a third node Q and a potential of a fourth node P. The second output module 30 outputs a second gate driving signal according to the potential of the second node K. The voltage stabilizing module 40 is electrically connected to a first power line and a second power line and transmits a voltage on the first power line or a voltage on the second power line to the second node K according to the voltage of the fourth node P. The first driving control module 50 controls the voltage of the fourth node P according to the voltage of the second node K.

The voltage stabilizing module 40 includes a first transistor T4. A gate of the first transistor T4 is configured to receive a clock signal, and an operation mode of the gate driving circuit includes a low power consumption mode. When the gate driving circuit is in the low power consumption mode, the clock signal is a first voltage, and the first voltage turns on the first transistor.

It can be understood that the gate driving circuit provided in this embodiment is electrically connected to the second node K by arranging the voltage stabilizing module 40. When the gate driving circuit is in the low power consumption mode, the first transistor T4 may be turned on to maintain the potential of the second node K. Therefore, when the clock signal is of low frequency, the potential of the second node K may not decrease due to the influence of leakage, and the potential of the second node K can be kept at a high potential. Therefore, the gate driving circuit provided in this embodiment can reduce the power consumption of the gate driving circuit by reducing the frequency of the clock signal, and no display abnormality may occur. This further solves issues in related technologies that a reduction in clock signal frequency may cause the output of the stage circuit to be abnormal, resulting in display issues on the display panel.

In one embodiment, the first transistor T4 is an N-channel thin film transistor. The clock signal includes a first clock signal (XCK). The gate of the first transistor T4 is configured to receive the first clock signal. When the gate driving circuit is in the low power consumption mode, the voltage of the first clock signal is a first voltage, the first voltage is a high potential, and the first transistor T4 is turned on.

Specifically, the first transistor is a double-gate indium gallium zinc oxide thin film transistor, and the first gate of the first transistor and the second gate of the first transistor are both configured to receive the first clock signal.

What needs to be explained is that, when the first clock signal maintains a high potential state at a low frequency, the gate driving circuit in this embodiment can maintain the potential of the second node K through the first transistor T4 in the voltage stabilizing module 40. Therefore, while reducing the frequency of the clock signal, the gate driving circuit may not output abnormally. Therefore, in this application, the power consumption of the gate driving circuit can be reduced by keeping the clock signal at a high potential at a low frequency.

In one embodiment, the first transistor T4 is a P-channel thin film transistor. When the gate driving circuit is in the low power consumption mode, the voltage of the first clock signal is the first voltage. The first voltage is low potential, and the first transistor T4 is turned on.

What needs to be explained is that, when the first clock signal maintains a low potential state at a low frequency, the gate driving circuit in this embodiment can maintain the potential of the second node K through the first transistor T4 in the voltage stabilizing module 40. Therefore, while reducing the frequency of the clock signal, the gate driving circuit may not output abnormally. Therefore, in this application, the power consumption of the gate driving circuit can be reduced by keeping the clock signal at a high potential at a low frequency.

In one embodiment, the first driving control module 50 is electrically connected to the second node K and the fourth node P, and the first driving control module 50 is configured to control the voltage of the fourth node P according to the voltage of the second node K. An input terminal of the first driving control module 50 is electrically connected to an output terminal of the input module 10, and an output terminal of the first driving control module 50 is electrically connected to the fourth node P.

The voltage stabilizing module 40 is electrically connected to the second node K, a first power line, and a second power line. The voltage stabilizing module 40 is configured to maintain the potential of the second node K to be the potential of the first power line or the potential of the second power line according to the first clock signal and the potential of the fourth node P.

In one embodiment, the first driving control module 50 includes a fifth transistor T3 and a sixth transistor T1. One of a source or a drain of the fifth transistor T3 is electrically connected to the first power line, and another of the source or the drain of the fifth transistor T3 is electrically connected to one of a source or a drain of the sixth transistor T1 and the fourth node P. Another of the source or the drain of the sixth transistor T1 is electrically connected to the third power line. The output terminal of the input module 10 is electrically connected to a gate of the fifth transistor T3, a first gate of the sixth transistor T1, and a second gate of the sixth transistor T1.

It should be noted that the fifth transistor T3 is a P-channel thin film transistor. The sixth transistor T1 is a double-gate N-channel thin film transistor. In this way, a dynamic performance of the fifth transistor T3 and the sixth transistor T1 can be improved, thereby improving the dynamic performance of the first driving control module 50.

The voltage stabilizing module 40 includes a first transistor T4 and a second transistor T5. One of a source or a drain of the first transistor T4 is electrically connected to the output terminal of the input module 10 and the second node K. A gate of the first transistor T4 is electrically connected to the first clock line to receive the first clock signal. Another of the source or the drain of the first transistor T4 is electrically connected to one of a source or a drain of the second transistor T5. Another of the source or the drain of the second transistor T5 is electrically connected to the first power line. A gate of the second transistor T5 is electrically connected to the output terminal of the first driving control module 50 and the fourth node P.

It should be noted that the voltage stabilizing module 40 can maintain the second node K at a high potential according to the potential of the fourth node P and the potential of the first clock line. That is to say, when the fourth node P is at a low potential, the first power line can control the potential of the second node K to the potential of the first power signal PVGH.

In an embodiment, the voltage stabilizing module 40 further includes a third transistor T14. One of the source or the drain of the third transistor T14 is electrically connected to the second power line. Another of the source or the drain of the third transistor T14 is electrically connected to the second node K. A gate of the third transistor T14 is connected to the fourth node P.

It should be noted that the voltage stabilizing module 40 can maintain the potential of the second node K at a low potential according to the potential of the fourth node P. That is to say, when the fourth node P is at a high potential, the second power line can control the potential of the second node K to the potential of the second power signal VGL.

The third transistor T14 is an N-channel thin film transistor. The third transistor T14 is a double-gate thin film transistor. This can not only improve ability to control current flowing through itself, but also reduce a drift amplitude of a threshold voltage.

In an embodiment, the sixth transistor T1, the first transistor T4, and the third transistor T14 may all be indium gallium zinc oxide thin film transistors.

In one embodiment, the gate driving circuit further includes a second driving control module 70. The second driving control module 70 is electrically connected between the second node K and the third node Q. An input terminal of the second driving control module 70 is electrically connected to the output terminal of the input module 10. A control terminal of the second driving control module 70 is electrically connected to the driving control line.

The input terminal of the second output module 30 is electrically connected to the output terminal of the input module 10. The output terminal of the second output module 30 is electrically connected to a Nth stage positive pulse gate driving line. The number of positive pulses output by the Nth stage positive pulse gate driving line in one frame is greater than the number of negative pulses output by the Nth stage negative pulse gate driving line in one frame.

It should be noted that the Nth stage positive pulse gate driving line, that is, the second gate driving line, is used to transmit the Nth stage positive pulse gate driving signal Nout[N], that is, the second gate driving signal. The second gate driving signal can be used as a stage transmission signal of the stage circuit. The Nth stage negative pulse gate driving line, that is, the first gate driving line, is used to transmit the Nth stage negative pulse gate driving signal Pout[N], that is, the first gate driving signal.

What needs to be explained is that, the gate driving circuit provided in this embodiment can not only output a second gate driving signal with a larger number of pulses through the input module 10 and the second output module 30, but also the second gate driving signal can also be selected as a stage transmission signal between different stage circuits. The input module 10, the second driving control module 70, the first driving control module 50, and the first output module 20 can output a first gate driving signal with a smaller number of pulses. This can meet the needs of the corresponding pixel circuit in terms of time and quantity of gate driving signal pulses in one frame, thereby driving the pixel circuit to achieve image quality display.

In one embodiment, the second driving control module 70 includes a transistor T11. One of a source or a drain of the transistor T11 is electrically connected to the output terminal of the input module 10. Another one of the source or the drain of the transistor T11 is electrically connected to the control terminal of the first output module 20. A gate of the transistor T11 is electrically connected to the driving control line. The transistor T11 is a P-channel thin film transistor. The driving control line is configured to transmit the driving control signal RST.

It should be noted that the output terminal of the input module 10 is the second node K. One of the control terminals of the first output module 20 is the third node Q. Another one of the source or the drain of the transistor T11 is the node W. The second driving control module 70 is configured to reduce the double pulse appearing in one frame of the second node K into a single pulse appearing in one frame of the third node Q. Specifically, the first pulse appearing in one frame of the second node K is eliminated, while the second pulse appearing in the same frame is retained.

It should be noted that this embodiment is conducive to ensuring the output stability of the Nth potential negative pulse gate driving signal Pout[N] and avoiding the coupled pull-down phenomenon before the negative pulse arrives.

In one embodiment, the second driving control module 70 further includes a first capacitor C2. One end of the first capacitor C2 is electrically connected to the gate of the transistor T11, and the other end of the first capacitor C2 is electrically connected to the other one of the source or the drain of the transistor T11.

It should be noted that this embodiment is conducive to further improving the output stability of the Nth potential negative pulse gate driving signal Pout[N].

It should be noted that the output terminal of the input module 10 is the second node K. The control terminal of the first output module 20 is the third node Q. The other one of the source or the drain of the transistor T11 is the node W. The second driving control module 70 is configured to reduce the double pulse appearing in one frame of the second node K into a single pulse appearing in one frame of the third node Q. Specifically, the first pulse appearing in one frame of the second node K is eliminated, while the second pulse appearing in the same frame is retained.

In one embodiment, the first output module 20 includes a transistor T6 and a second capacitor C1. A gate of the transistor T6 is electrically connected to one of the source or the drain of the transistor T11. One of the source or the drain of the transistor T6 is electrically connected to a second clock line. The other one of the source or the drain of the transistor T6 is electrically connected to the Nth stage negative pulse gate driving line. One end of the second capacitor C1 is electrically connected to the gate of the transistor T6, and the other end of the second capacitor C1 is electrically connected to the other one of the source or the drain of the transistor T6. An ratio of capacities of the first capacitor C2 and the second capacitor C1 is greater than or equal to 0.5.

It should be noted that in this embodiment, the ratio of the capacities of the first capacitor C2 and the second capacitor C1 is designed to further ensure the output stability of the Nth stage negative pulse gate driving signal Pout[N]. This avoids coupling pull-down behavior before a negative pulse occurs.

Specifically, the capacity of the first capacitor C2 may be greater than or equal to 50 fF. The capacity of the second capacitor C1 may be greater than or equal to 100 fF. In some embodiments, the transistor T6 may be a P-channel thin film transistor.

In one of the embodiments, the first output module 20 includes a transistor T7. One of the source or the drain of the transistor T7 is electrically connected to the first power line. The other one of the source or the drain of the transistor T7 is electrically connected to the Nth stage negative pulse gate driving line. The gate of the transistor T7 is electrically connected to the output terminal of the first driving control module 50, that is, the fourth node P.

It should be noted that the transistor T7 may be a P-channel thin film transistor. Under the joint action of the first output module 20 and the first output module 20, the required Nth stage negative pulse gate driving signal Pout [N] can be modulated.

In one embodiment, the input module 10 includes a transistor T2, a transistor T13, and a transistor T12. One of a source or a drain of the transistor T13 is electrically connected to a third power line. The other one of the source or the drain of the transistor T13 is electrically connected to the input terminal of the input module 10. A first gate of the transistor T13 is electrically connected to a start control line or the N-Yth stage positive pulse gate driving line. The first gate of the transistor T13 is electrically connected to a second gate of the transistor T13, and the transistor T13 is an N-channel thin film transistor. One of the source or the drain of the transistor T12 is electrically connected to the first power line. The other one of the source or the drain of the transistor T12 is electrically connected to the other one of the source or the drain of the transistor T13. A gate of the transistor T12 is electrically connected to the first gate of the transistor T13. The transistor T12 is a P-channel thin film transistor. One of the source or the drain of the transistor T2 is electrically connected to the output terminals of the transistors T13 and T12. The other one of the source or the drain of the transistor T2 is electrically connected to the input terminal of the second driving control module 70. The gate of transistor T2 is electrically connected to the first clock line. In some embodiments, the transistor T2 may be a P-channel thin film transistor.

It should be noted that in this embodiment, the input module 10 not only has an objective inversion effect, that is, the input signal and the output signal have opposite potentials at the same time, but also plays the role of making the Nth stage positive pulse gate driving signal Nout[N] serve as a stage transmission signal between stage circuits. Otherwise, stage transmission cannot be achieved between circuits at all stages, resulting in the gate driving circuit being unable to provide the corresponding gate driving signal normally.

In one embodiment, the second output module 30 includes a P-channel transistor T9 and an N-channel transistor T10. The first electrode of the transistor T9 is electrically connected to the fourth power line, and the gate of the transistor T9 is electrically connected to the second node K. The first electrode of the transistor T10 is electrically connected to the second electrode of the transistor T9 to output the second gate driving signal, and the gate of the transistor T10 is electrically connected to the gate of the transistor T9.

In one embodiment, the gate of the transistor T10 includes a first gate and a second gate. The second node K is electrically connected to the first gate of the transistor T10 and the second gate of the transistor T10.

It should be noted that in this embodiment, the transistor T10 may be a double-gate thin film transistor. It can not only improve ability to control the current flowing through itself, but also reduce a drift amplitude of a threshold voltage. The transistor T10 is an indium gallium zinc oxide thin film transistor.

The first power line is configured to transmit a first power signal PVGH. The first power signal PVGH can control the N-channel thin film transistor to turn on or control the P-channel thin film transistor to turn off. The second power line is configured to transmit a second power signal NVGL. The second power signal NVGL can control the P-channel thin film transistor to turn on or the N-channel thin film transistor to turn off. The third power line is configured to transmit the third power signal PVGL, and the fourth power line is configured to transmit the second power signal NVGH.

In one embodiment, the third power signal PVGL is smaller than the second power signal NVGL, so that the third transistor T14 is turned off more completely when it is in the off state.

In one embodiment, the second output module 30 outputs the second gate driving signal according to the potential of the second node K. The number of pulses of the second gate driving signal in one frame is greater than the number of pulses of the first gate driving signal in one frame.

The transistor T9 is a P-channel thin film transistor. The transistor T10 is a double-gate N-channel thin film transistor. In this way, the dynamic performance of the transistor T9 and the transistor T10 can be improved, and thus the dynamic performance of the second output module 30 can be improved.

It should be noted that the Nth stage positive pulse gate driving line is used to transmit the Nth stage positive pulse gate driving signal Nout[N]. The Nth stage negative pulse gate driving line is used to transmit the Nth stage negative pulse gate driving signal Pout[N]. The first clock line is used to transmit the first clock signal XCK. The second clock line is used to transmit the second clock signal CK. The start control line is used to transmit the start control signal STV. The N-Yth stage positive pulse gate driving line is used to transmit the N-Yth stage positive pulse gate driving signal Nout [N-Y]. The N-Xth stage positive pulse gate driving line is used to transmit the N-Xth stage positive pulse gate driving signal Nout [N-X]. The driving control line is used to transmit the driving control signal RST.

In one embodiment, the second driving control module 70 further includes an anti-leakage transistor T8. One of the source or the drain of the anti-leakage transistor T8 is electrically connected to the other of the source or the drain of the transistor T11. The other one of the source or the drain of the anti-leakage transistor T8 is electrically connected to the control terminal of the first output module 20. A gate of the anti-leakage transistor T8 is electrically connected to an anti-leakage signal line to receive an anti-leakage signal.

The anti-leakage signal line may be a positive pulse gate drive line N[n−X]. Specifically, it can be the N−2th stage positive pulse gate driving line, and the anti-leakage signal is the N−2th stage positive pulse gate driving signal N[n−2].

Figure 5:
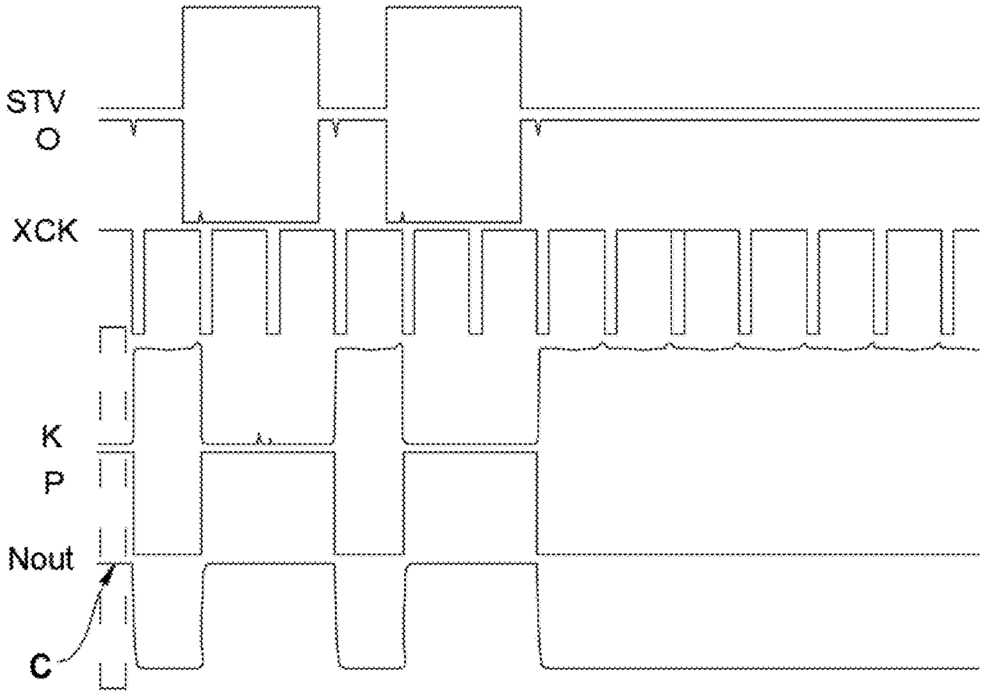
FIG. 5 is a timing diagram of some signals in the gate driving circuit shown in FIG. 1.

As shown at c in FIG. 5, when the first clock signal XCK signal of the transistor T2 does not start to operate, the second node K is in the floating state. When the second node K randomly reaches a low potential state, the second output module 30 outputs a high potential. This causes a series of cascading reactions, causing the first frame output of all lines to be abnormal.

In order to solve the above issues, in one embodiment, the Nth stage circuit further includes a reset module 60. The reset module 60 controls the voltage of the second node according to the reset signal control. The reset module 60 includes a fourth transistor T15. One of the source or the drain of the fourth transistor T15 is connected to the first power line. The other one of the source or the drain of the fourth transistor T15 is connected to the second node. The gate of the fourth transistor T15 receives the reset signal control.

The reset signal control is only turned on once every time the gate driving circuit is powered on. That is, the fourth transistor T15 is turned on to pull the potential of the second node K to a high potential. At this time, the above-mentioned start signal STV, first clock signal XCK, second clock signal CK, anti-leakage signal N[n−2], and driving control signal RST have not started to transmit signals.

Figure 6:
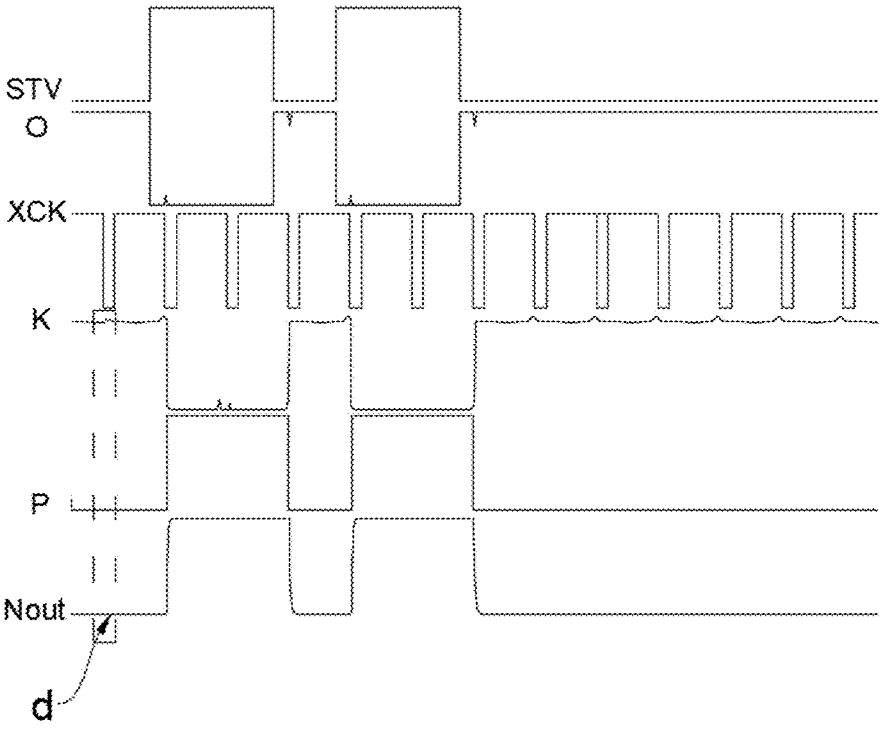
FIG. 6 is a timing diagram of some signals in the gate driving circuit shown in FIG. 3.

It can be understood that the reset module 60 can ensure that the second node K is at a high level every time the gate drive circuit is powered on, so that the above abnormal output situation will not occur, as shown at d in FIG. 6.

Figure 7:
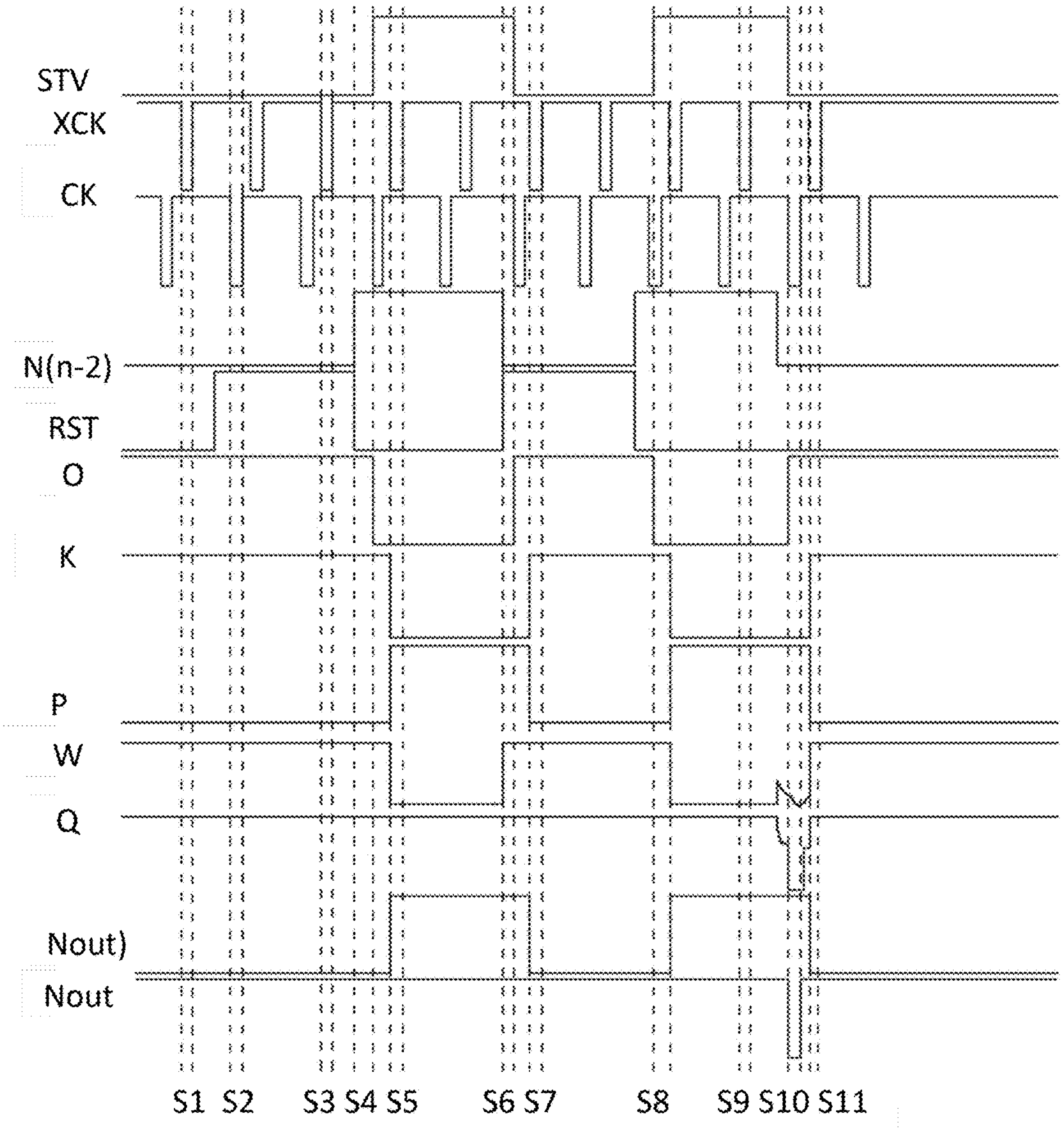
FIG. 7 is a timing diagram of the gate driving circuit shown in FIG. 3.
Figure 8:
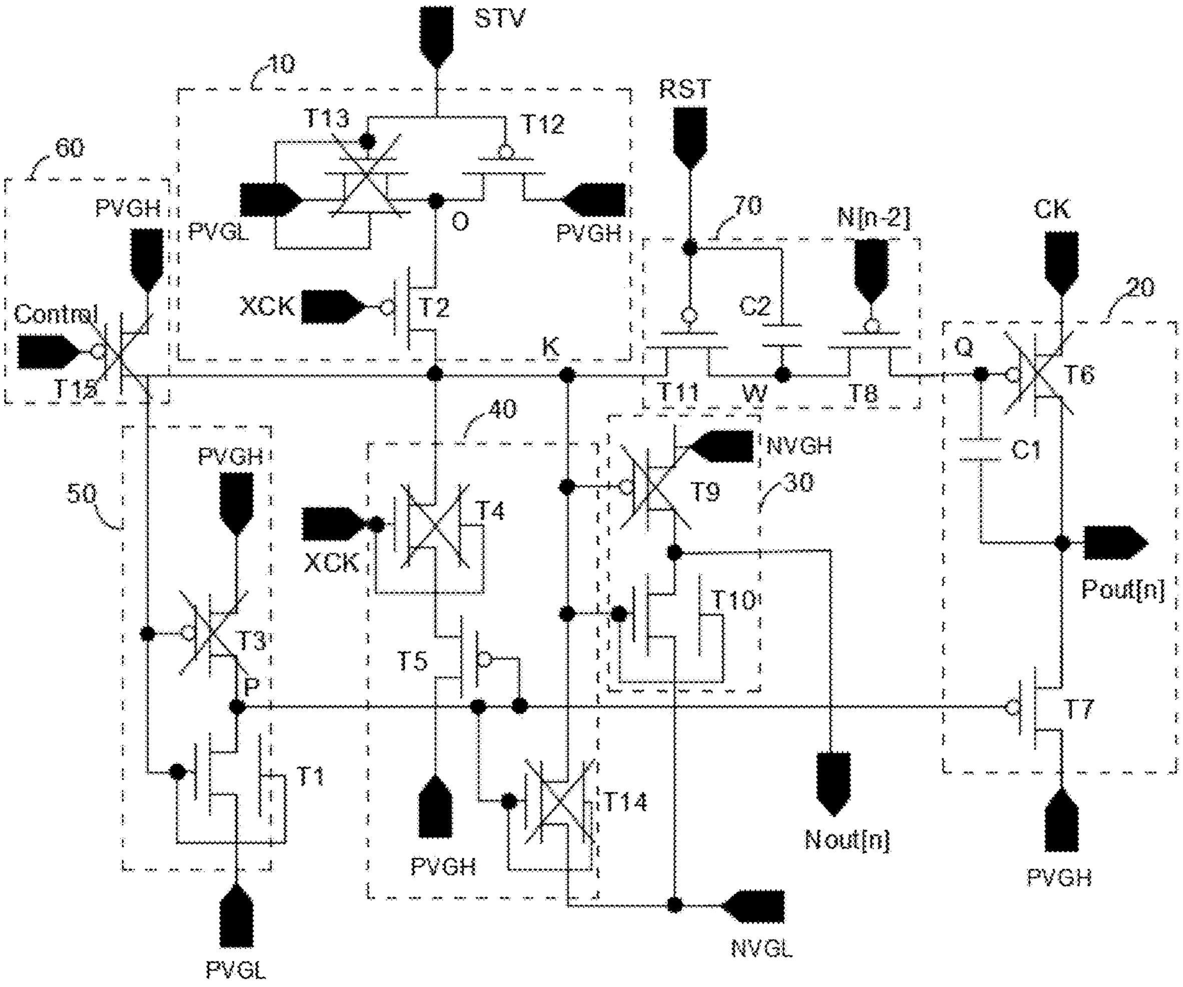
FIG. 8 is a schematic diagram of a state of the gate driving circuit shown in FIG. 3 in a first stage in FIG. 7.

The working process of the above-mentioned stage circuit in one frame can include the following stages as shown in FIG. 7:

The first stage S1: As shown in FIG. 7 and FIG. 8, the start control signal STV, the driving control signal RST, the first clock signal XCK, and the anti-leakage signal N[n−2] are all at low potential. The second clock signal CK is at a high potential. The first node O, the second node K, and the third node Q are all at high potential. The fourth node P is at low potential. The Nth stage positive pulse gate driving signal Nout[N] is at a low potential, and the Nth stage negative pulse gate driving signal Pout[N] is at a high potential.

Figure 9:
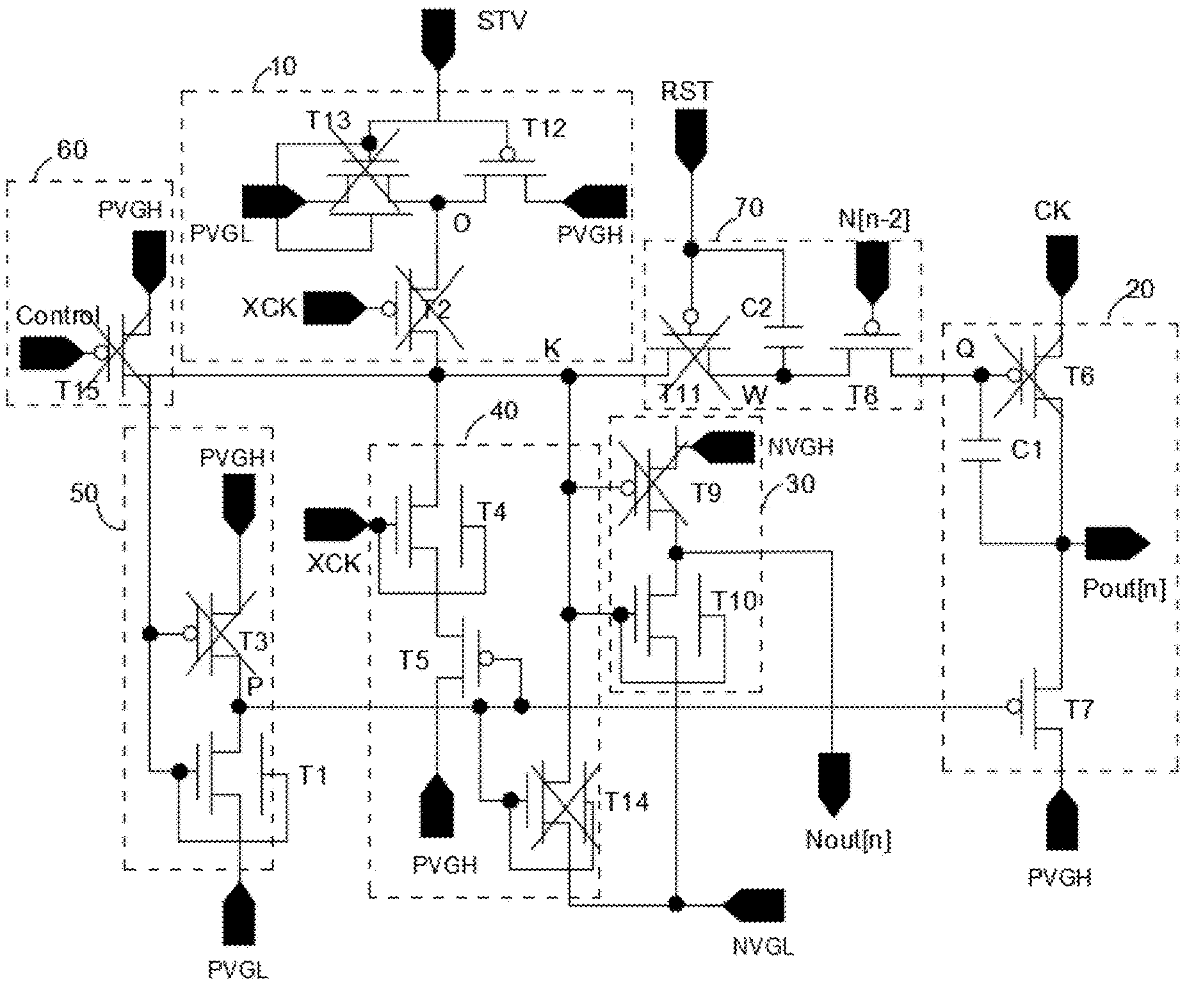
FIG. 9 is a schematic diagram of a state of the gate driving circuit shown in FIG. 3 in a second stage in FIG. 7.

The second stage S2: As shown in FIG. 7 and FIG. 9, the start control signal STV, the second clock signal CK, and the anti-leakage signal N[n−2] are all at low potential. The driving control signal RST and the first clock signal XCK are at a high potential. The first node O, the second node K, and the third node Q are all at high potential. The fourth node P is at low potential. The Nth stage positive pulse gate driving signal Nout [N] is at a low potential. The Nth stage negative pulse gate driving signal Pout[N] is at a high potential.

Figure 10:
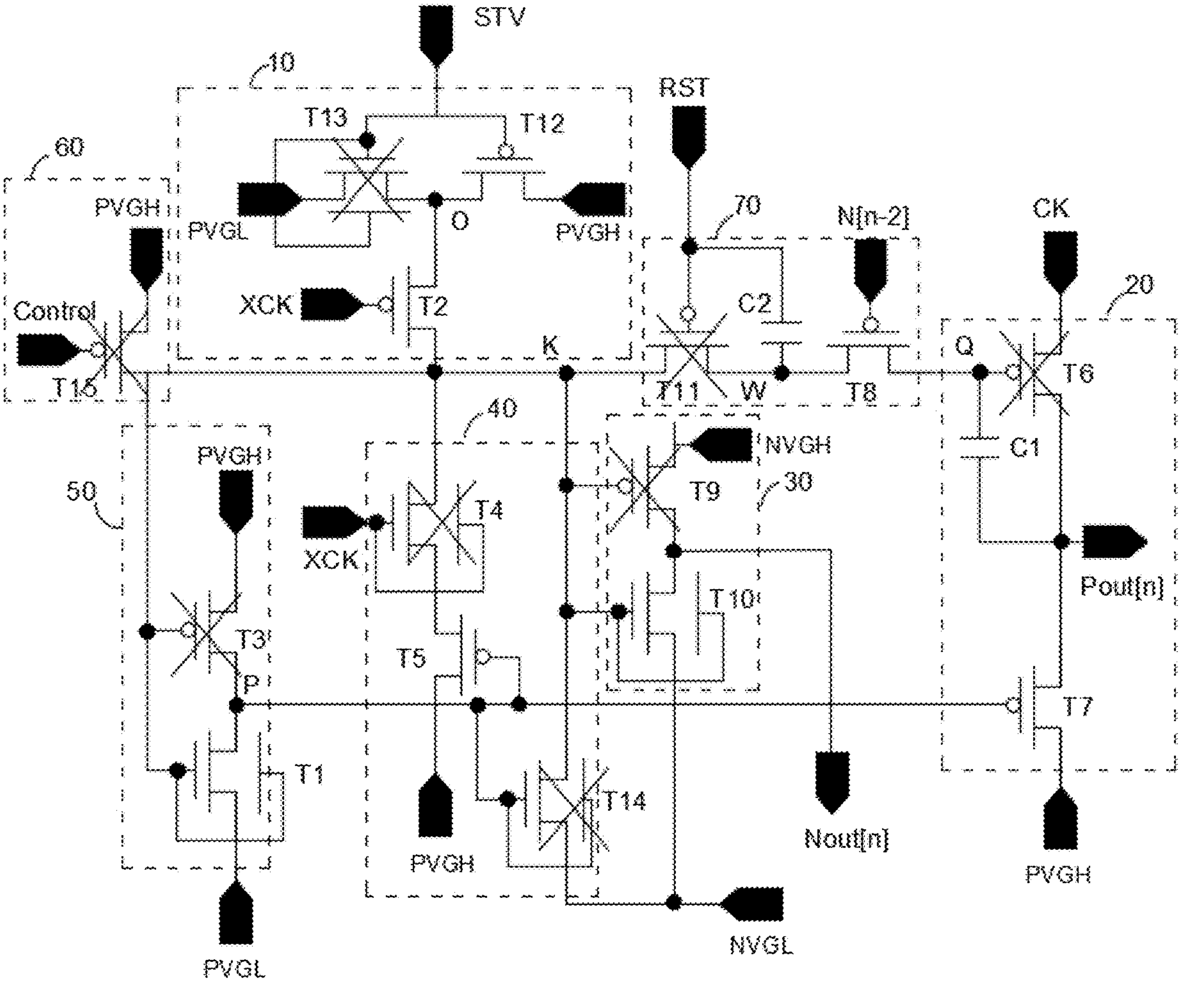
FIG. 10 is a schematic diagram of a state of the gate driving circuit shown in FIG. 3 in a third stage in FIG. 7.

The third stage S3: As shown in FIG. 7 and FIG. 10, the start control signal STV, the first clock signal XCK, and the anti-leakage signal N[n−2] are all at low potential. The driving control signal RST and the second clock signal CK are both at a high potential. The first node O, the second node K, and the third node Q are all at high potential. The fourth node P is at low potential. The Nth stage positive pulse gate driving signal Nout[N] is at a low potential. The Nth stage negative pulse gate driving signal Pout[N] is at a high potential.

Figure 11:
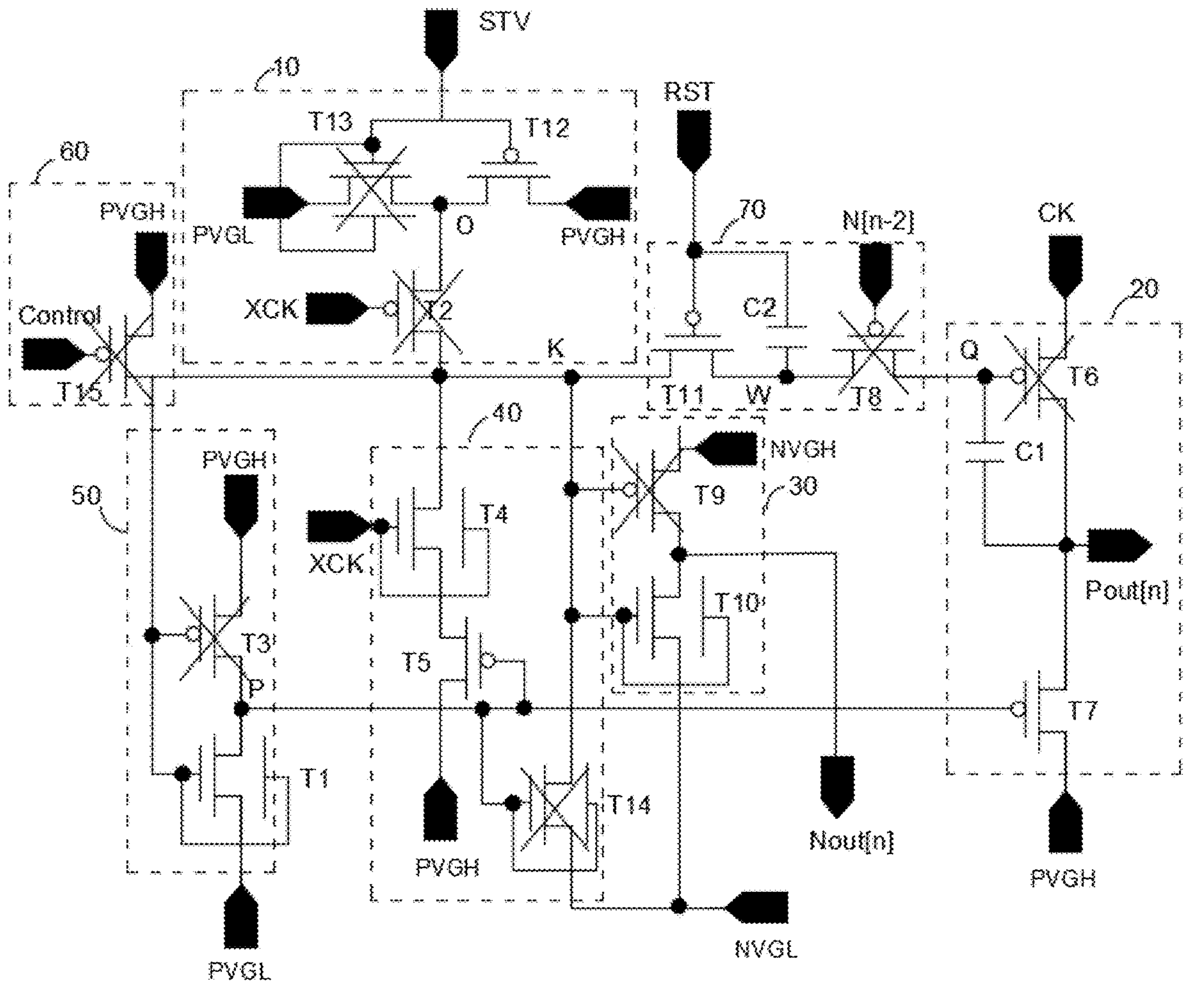
FIG. 11 is a schematic diagram of a state of the gate driving circuit shown in FIG. 3 in a fourth stage in FIG. 7.

The fourth stage S4: As shown in FIG. 7 and FIG. 11, the driving control signal RST and the start control signal STV are at low potential. The first clock signal XCK, the second clock signal CK, and the anti-leakage signal N[n−2] are all at high potential. The first node O, the second node K, and the third node Q are all at high potential. The fourth node P is at low potential. The Nth stage positive pulse gate driving signal Nout[N] is at a low potential. The Nth stage negative pulse gate driving signal Pout[N] is at a high potential.

Figure 12:
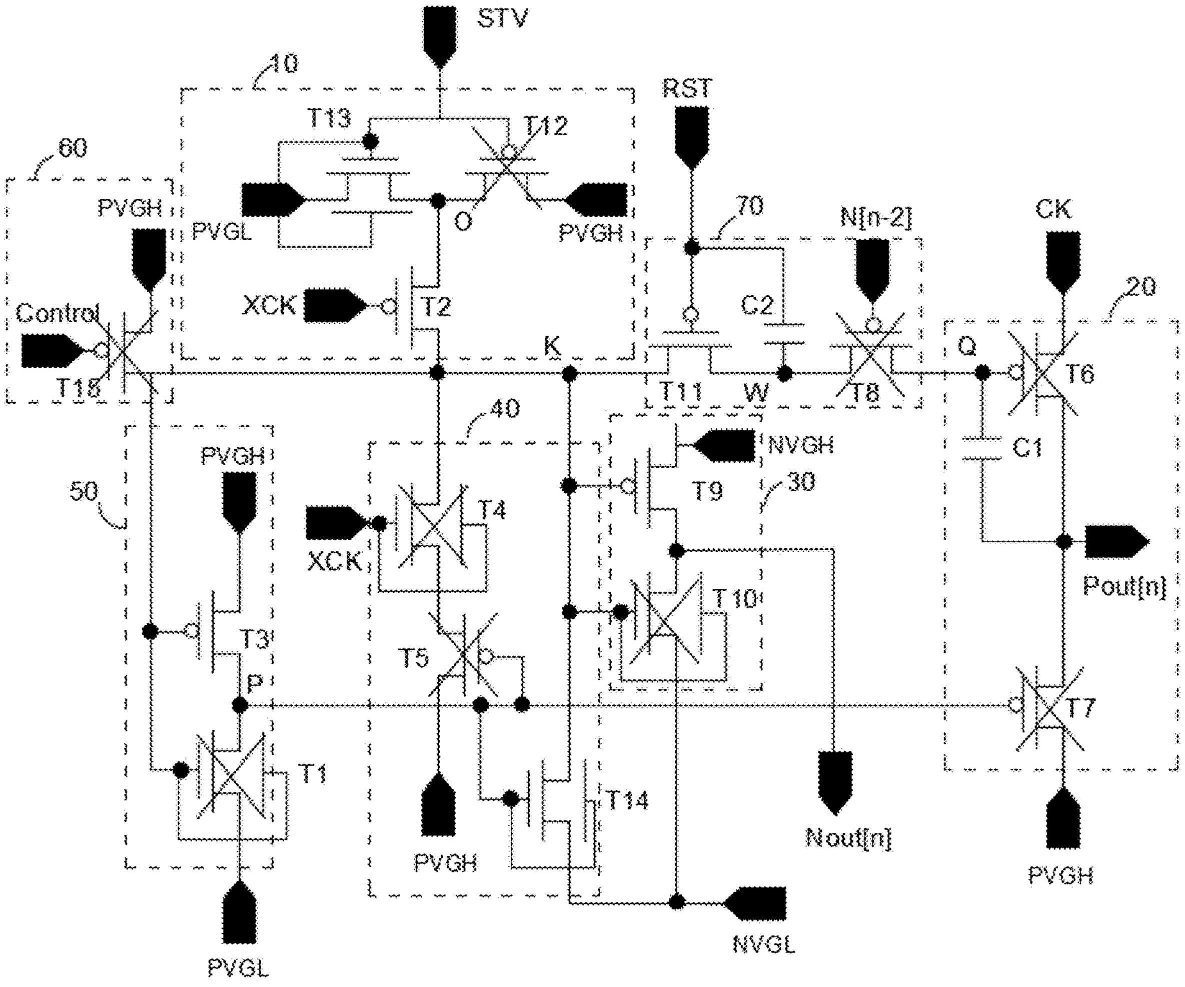
FIG. 12 is a schematic diagram of a state of the gate driving circuit shown in FIG. 3 in a fifth stage in FIG. 7.

The fifth stage S5: As shown in FIG. 7 and FIG. 12, the driving control signal RST and the first clock signal XCK are both at low potential. The start control signal STV, the second clock signal CK, and the anti-leakage signal N[n−2] are all at high potential. The third node Q and the fourth node P are both at high potential. The first node O and the second node K are both at low potential. The Nth stage positive pulse gate driving signal Nout[N] is at a high potential. The Nth stage negative pulse gate driving signal Pout[N] is at a high potential.

Figure 13:
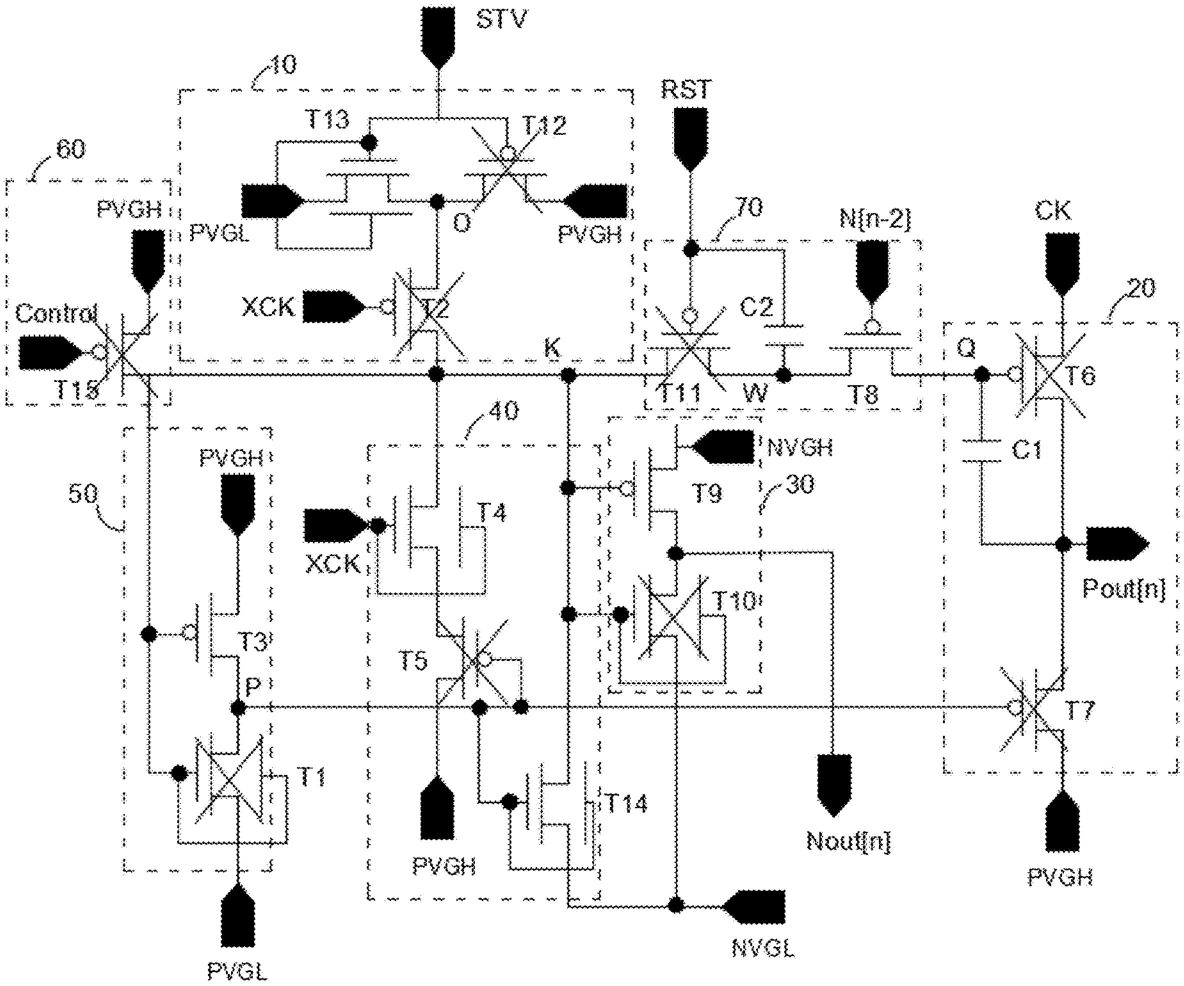
FIG. 13 is a schematic diagram of a state of the gate driving circuit shown in FIG. 3 in a sixth stage in FIG. 7.

The sixth stage S6: As shown in FIG. 7 and FIG. 13, the start control signal STV, the first clock signal XCK, the second clock signal CK, and the driving control signal RST are all at a high potential. The anti-leakage signal N[n−2] is at low potential. The third node Q and the fourth node P are both at high potential. The first node O and the second node K are at low potential. The Nth stage positive pulse gate driving signal Nout[N] is at a high potential. The Nth stage negative pulse gate driving signal Pout[N] is at a high potential.

Figure 14:
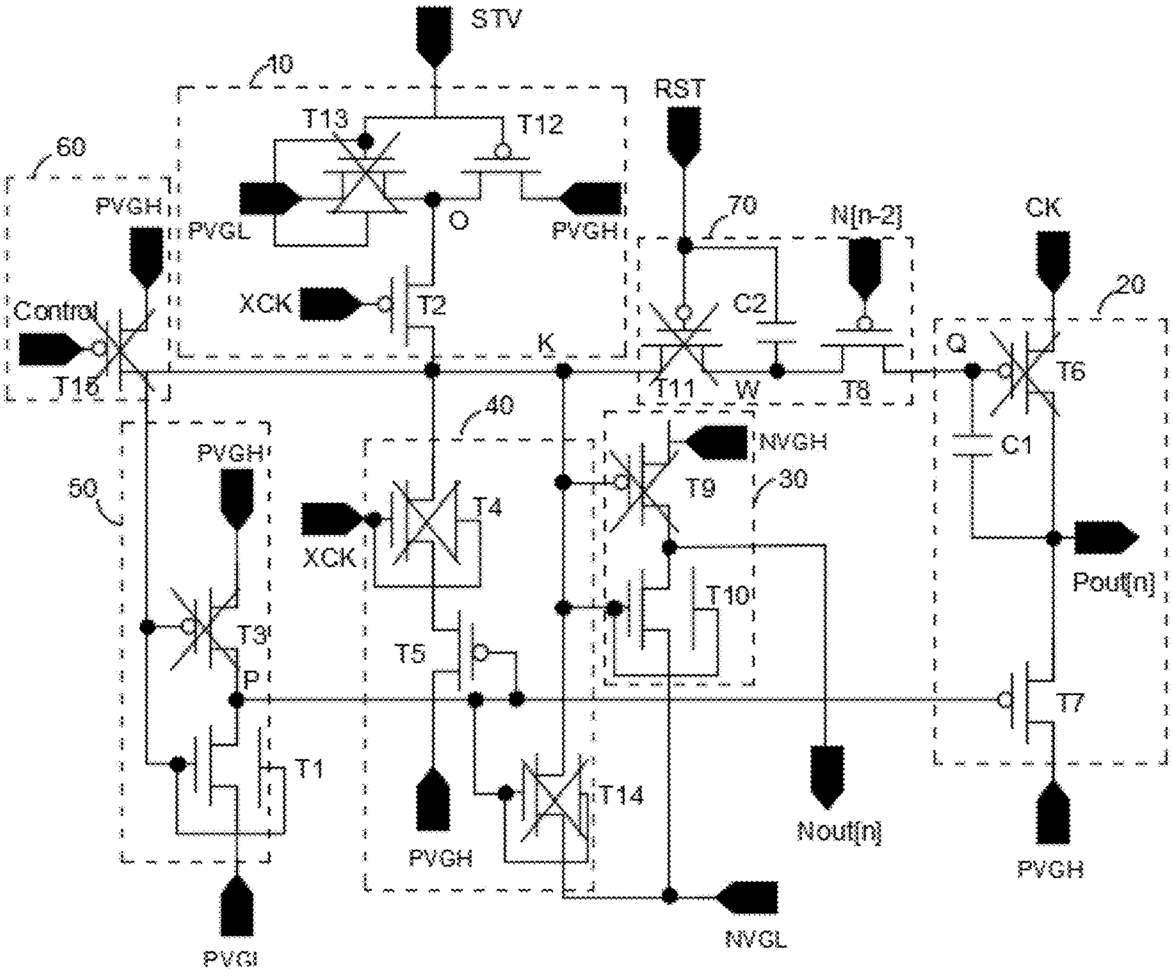
FIG. 14 is a schematic diagram of a state of the gate driving circuit shown in FIG. 3 in a seventh stage in FIG. 7.

The seventh stage S7: As shown in FIG. 7 and FIG. 14, the start control signal STV, the first clock signal XCK, and the anti-leakage signal N[n−2] are all at low potential. The second clock signal CK and the driving control signal RST are both at a high potential. The fourth node P is both at low potential. The first node O, the second node K, and the third node Q are at high potential. The Nth stage positive pulse gate driving signal Nout[N] is at a low potential. The Nth stage negative pulse gate driving signal Pout[N] is at a high potential.

Figure 15:
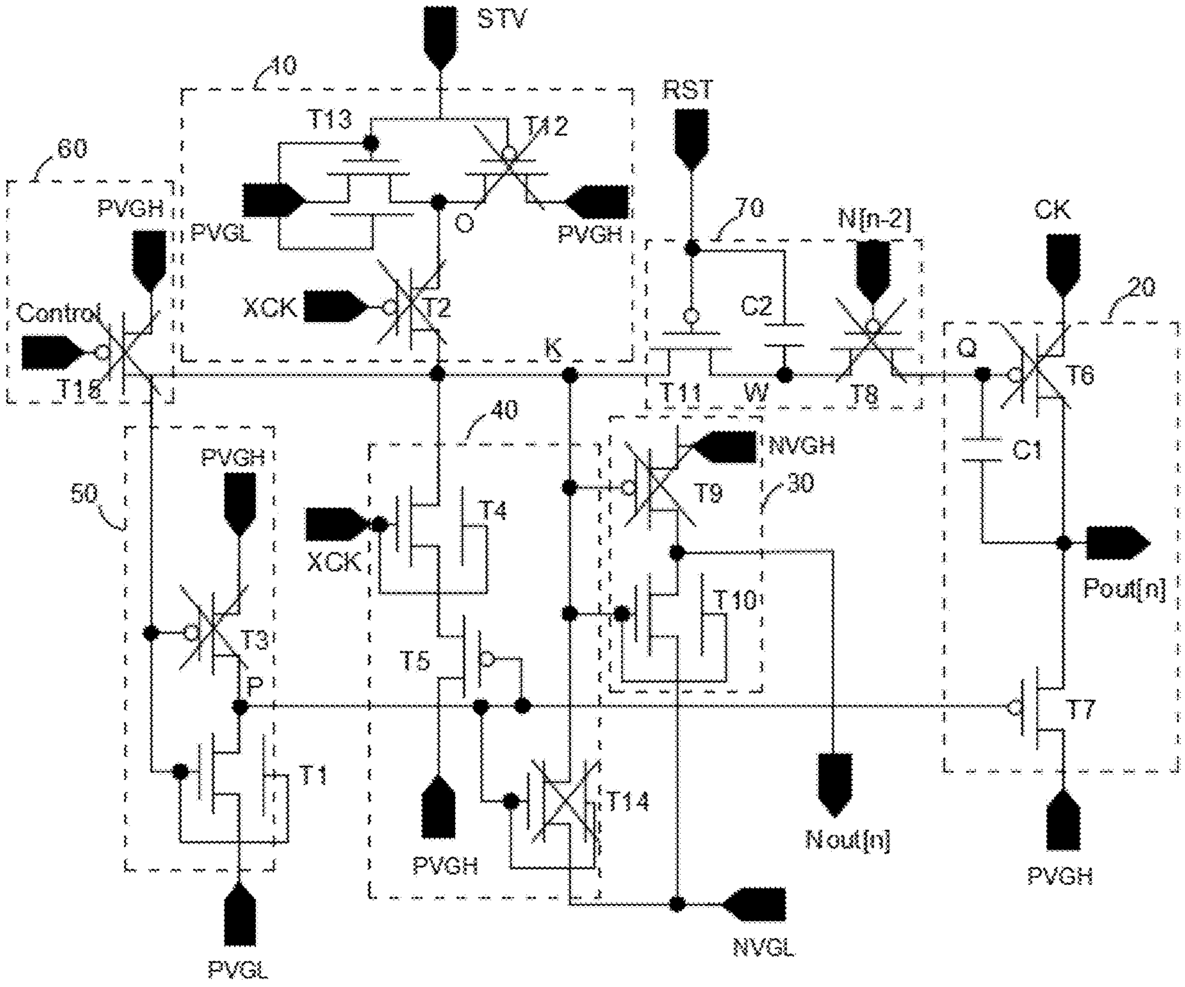
FIG. 15 is a schematic diagram of a state of the gate driving circuit shown in FIG. 3 in an eighth stage in FIG. 7.

The eighth stage S8: As shown in FIG. 7 and FIG. 15, the start control signal STV, the first clock signal XCK, and the anti-leakage signal N[n−2] are all at high potential. The driving control signal RST is at a low potential. The first node O and the fourth node P are at low potential. The third node Q and the second node K are both at high potential. The Nth stage positive pulse gate driving signal Nout[N] is at a low potential. The Nth stage negative pulse gate driving signal Pout[N] is at a high potential.

Figure 16:
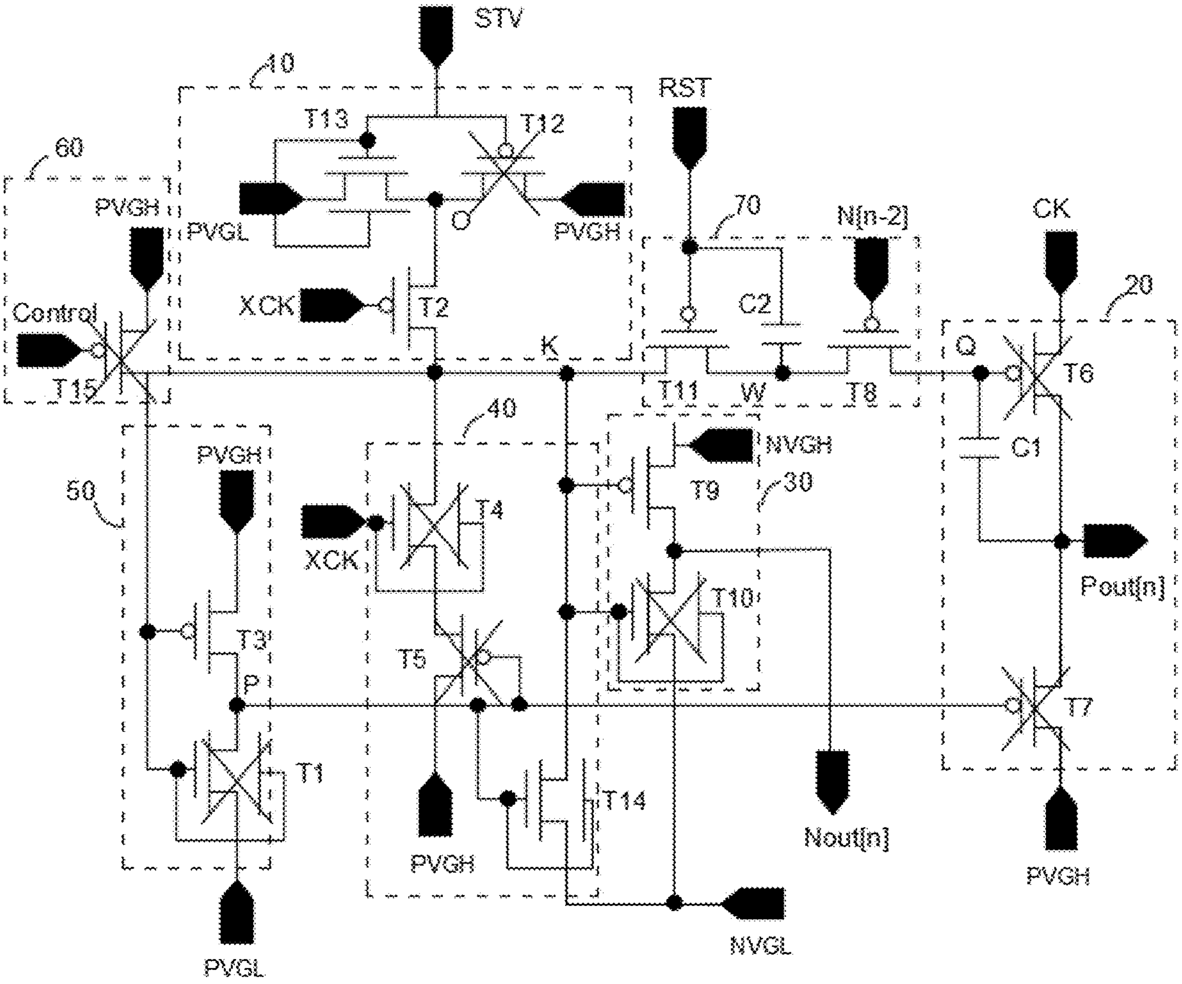
FIG. 16 is a schematic diagram of a state of the gate driving circuit shown in FIG. 3 in a ninth stage in FIG. 7.

The ninth stage S9: As shown in FIG. 7 and FIG. 16, the driving control signal RST and the first clock signal XCK are both at low potential. The start control signal STV, the second clock signal CK, and the anti-leakage signal N[n−2] are at high potential. The first node O and the second node K are at low potential. The fourth node P and the third node Q are both at high potential. The Nth stage positive pulse gate driving signal Nout[N] is at a high potential. The Nth stage negative pulse gate driving signal Pout[N] is at a high potential.

Figure 17:
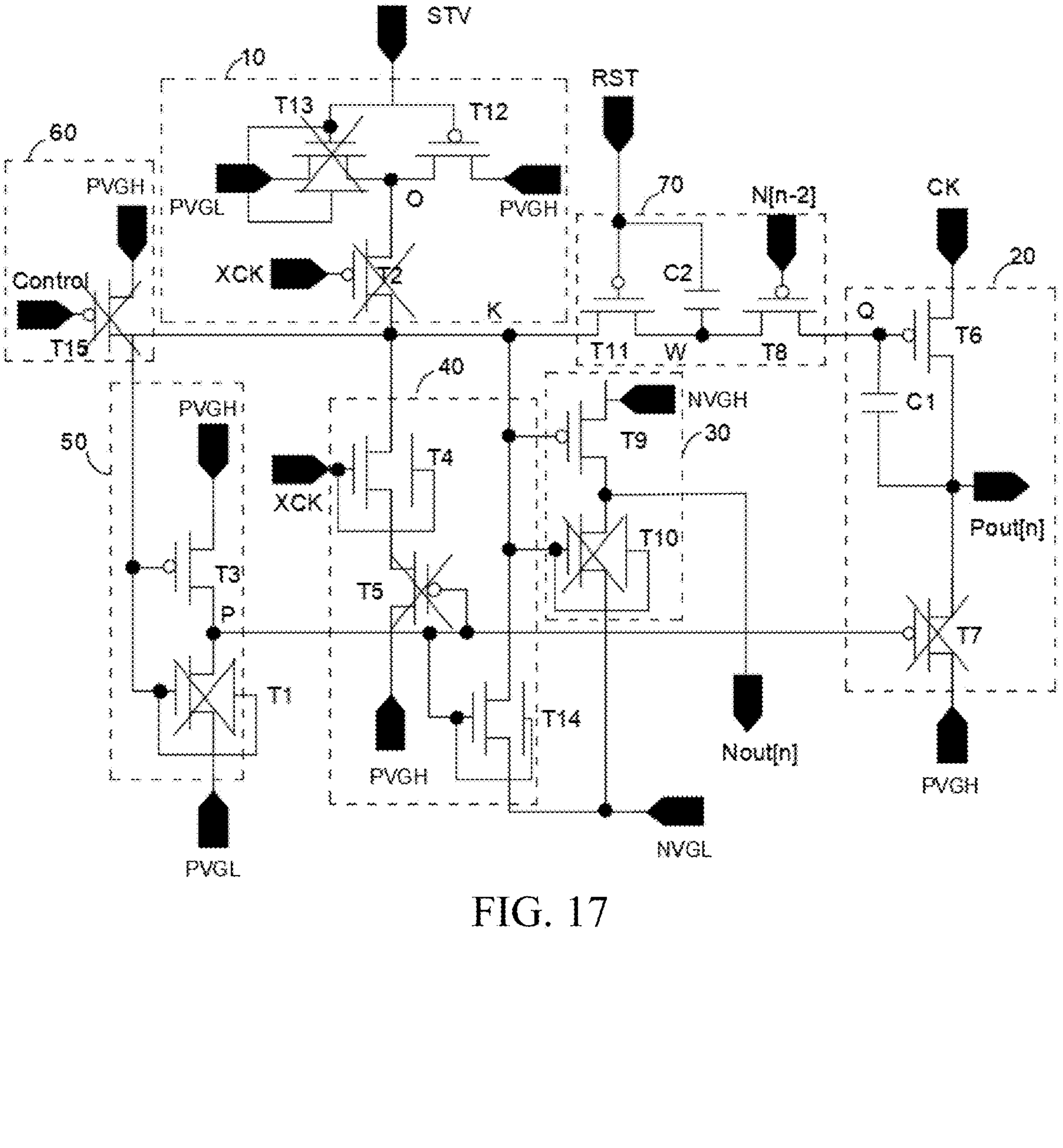
FIG. 17 is a schematic diagram of a state of the gate driving circuit shown in FIG. 3 in a tenth stage in FIG. 7.

The tenth stage S10: As shown in FIG. 7 and FIG. 17, the start control signal STV, the driving control signal RST, the second clock signal CK, and the anti-leakage signal N[n−2] are all at low potential. The first clock signal XCK is at a high potential. The first node O and the fourth node P are at high potential. The third node Q and the second node K are at low potential. The Nth stage positive pulse gate driving signal Nout[N] is at a high potential. The Nth stage negative pulse gate driving signal Pout[N] is at a low potentail.

Figure 18:
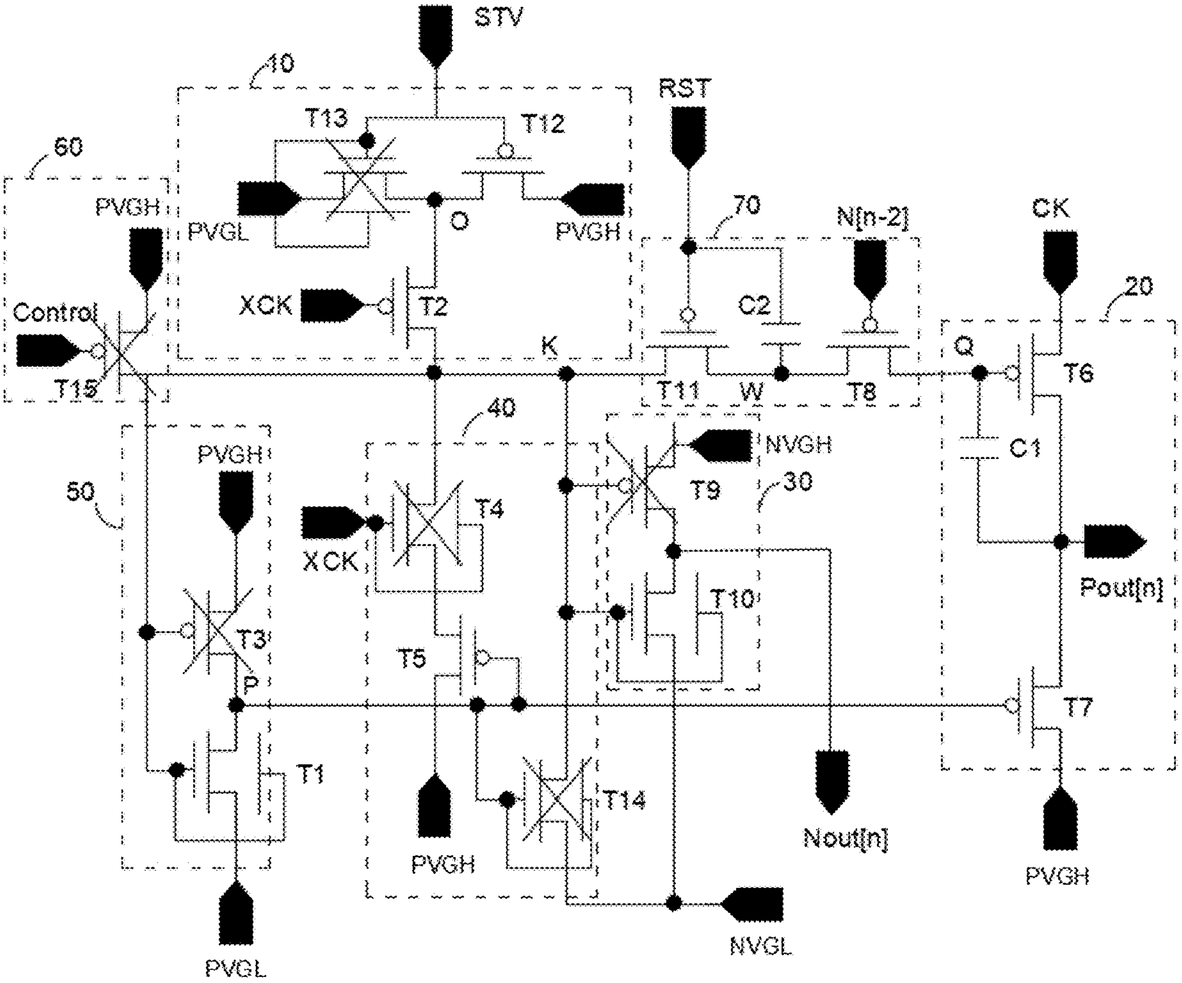
FIG. 18 is a schematic diagram of a state of the gate driving circuit shown in FIG. 3 in an eleventh stage in FIG. 7.

The eleventh stage S11: As shown in FIG. 7 and FIG. 18, the start control signal STV, the driving control signal RST, the first clock signal XCK, and the anti-leakage signal N[n−2] are all at low potential. The second clock signal CK is at a high potential. The fourth node P is at low potential. The first node O, the third node Q, and the second node K are at high potential. The Nth stage positive pulse gate driving signal Nout[N] is at a low potential. The Nth stage negative pulse gate driving signal Pout[N] is at a high potential.

It should be noted that the "crosses" in FIG. 8 to FIG. 18 indicate that the transistors covered by them are in the off state, and the transistors not covered by the "crosses" are in the on state.

It can be seen from FIG. 7 that the Nth stage positive pulse gate driving signal Nout[N] has a first positive pulse and a second positive pulse in one frame. The Nth stage negative pulse gate driving signal Pout[N] has a first negative pulse in one frame.

In one frame, the duration of the second positive pulse is longer than the duration of the first negative pulse, and the duration of the first negative pulse is located within the duration of the second positive pulse.

Figure 19:
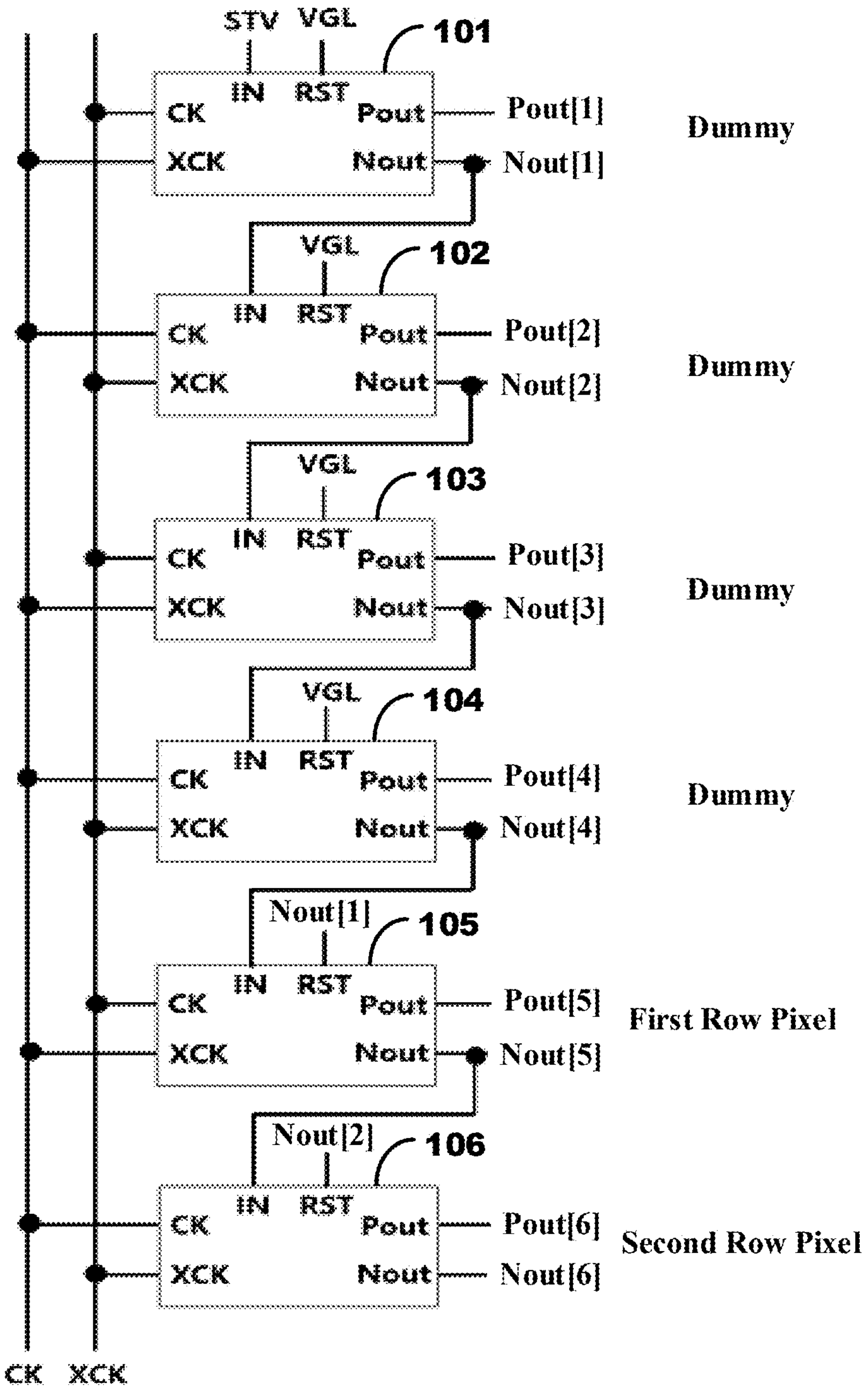
FIG. 19 is a schematic structural diagram of a cascade connection between different stages of circuits in the gate driving circuit shown in FIG. 3.

FIG. 19 is a schematic structural diagram of the cascade connection between different stages of circuits in the gate driving circuit shown in FIG. 3. Arranged from top to bottom are a first-stage circuit 101, a second-stage circuit 102, a third-stage circuit 103, a fourth-stage circuit 104, a fifth-stage circuit 105, a sixth-stage circuit 106 . . . and so on. The first clock line is electrically connected to each stage circuit respectively, and the second clock line is also electrically connected to each stage circuit respectively.

The first-stage circuit 101 respectively outputs the corresponding first-stage negative pulse gate driving signal Pout [1] and the first-stage positive pulse gate driving signal Nout[1] through the first-stage negative pulse gate driving line and the first-stage positive pulse gate driving line.

The second-stage circuit 102 respectively outputs the corresponding second-stage negative pulse gate driving signal Pout[2] and the second-stage positive pulse gate driving signal Nout[2] through the second-stage negative pulse gate driving line and the second-stage positive pulse gate driving line.

The third-stage circuit 103 respectively outputs the corresponding third-stage negative pulse gate driving signal Pout[3] and the third-stage positive pulse gate driving signal Nout[3] through the third-stage negative pulse gate driving line and the third-stage positive pulse gate driving line.

The fourth-stage circuit 104 respectively outputs the corresponding fourth-stage negative pulse gate driving signal Pout[4] and the fourth-stage positive pulse gate driving signal Nout[4] through the fourth-stage negative pulse gate driving line and the fourth-stage positive pulse gate driving line.

The fifth-stage circuit 105 respectively outputs the corresponding fifth-stage negative pulse gate driving signal Pout [5] and the fifth-stage positive pulse gate driving signal Nout[5] through the fifth-stage negative pulse gate driving line and the fifth-stage positive pulse gate driving line.

The sixth-stage circuit 106 respectively outputs the corresponding sixth-stage negative pulse gate driving signal Pout[6] and the sixth-stage positive pulse gate driving signal Nout[6] through the sixth-stage negative pulse gate driving line and the sixth-stage positive pulse gate driving line. Other stage circuits can be deduced in sequence.

The input terminal (IN) of the input module 10 in the first-stage circuit 101 is electrically connected to the start control line to receive the start control signal STV. The input terminals (IN) of the input module 10 in other stage circuits are connected to the positive pulse gate driving signal of the previous stage. For example, the input terminal (IN) of the input module 10 in the second-stage circuit 102 is connected to the first-stage positive pulse gate driving signal Nout[1]. The input terminal (IN) of the input module 10 in the third-stage circuit 103 is connected to the second-stage positive pulse gate driving signal Nout[2]. The input terminal (IN) of the input module 10 in the fourth-stage circuit 104 is connected to the third-stage positive pulse gate driving signal Nout[3]. The input terminal (IN) of the input module 10 in the fifth-stage circuit 105 is connected to the fourth-stage positive pulse gate driving signal Nout[4]. The input terminal (IN) of the input module 10 in the sixth-stage circuit 106 is connected to the fifth-stage positive pulse gate driving signal Nout[5]. Others can be deduced in turn. It is understandable that multiple stage circuits can also be cascaded at other intervals, which is not covered in this application.

The control terminal of the second driving control module 70 (transistor T8) in the fifth-stage circuit 105 is connected to the third-stage positive pulse gate driving signal Nout[3]. The control end of the second driving control module 70 in the sixth-stage circuit 106 is connected to the fourth-stage positive pulse gate driving signal Nout[4], and the others can be deduced in sequence. X can also be 3, 4, 5, 6, 7, etc. Here, X is equal to 2 as an example.

It should be noted that the output terminals of some stage circuits are connected to virtual pixels or are floating. Therefore, each output terminal of the Nth stage circuit is connected to not the Nth row pixel circuit. Instead, the number of rows of connected pixel circuits needs to be determined based on the number of connected dummy pixels or floating stage circuits.

Figure 20:
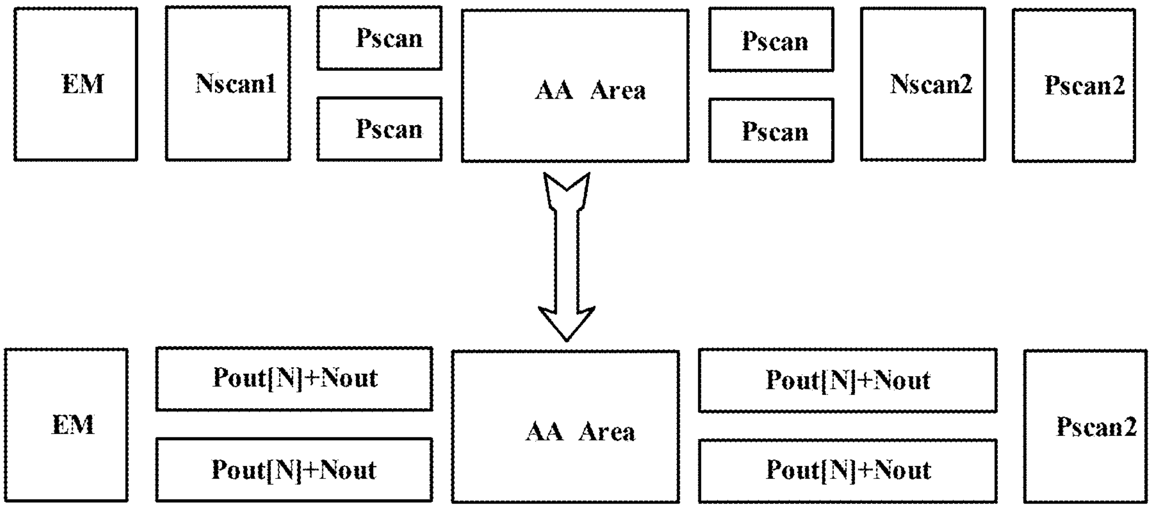
FIG. 20 is a schematic structural diagram of a display panel provided by an embodiment of the present application.

The upper picture in FIG. 20 is a schematic structural diagram of a display panel in traditional technology. Gate driving circuits for providing a light emitting control signal EM, a gate driving signal Nscan1, and a gate driving signal Pscan are respectively arranged on the left side (non-display area or frame area) of the display area (AA area). Gate driving circuits for providing the gate driving signal Pscan, the gate driving signal Nscan2, and the gate driving signal Pscan2 are respectively arranged on the right side (non-display area or frame area) of the display area (AA area).

Each gate driving signal Pscan drives one row of pixel circuits. The operation modes of the gate driving signal Nscan1 and the gate driving signal Nscan2 are also the same as the gate driving signal Pscan respectively. However, one gate driving signal Nscan1/gate driving signal Nscan2 needs to drive two rows of pixel circuits. In actual operation, in order to achieve a narrower frame, the gate driving circuit for outputting the gate driving signal Nscan1 and the gate driving circuit for outputting the gate driving signal Nscan2 are both set to single-sided driving. However, this may cause the driving capabilities of the two gate driving circuits to deteriorate and the power consumption to increase.

In view of this, in this embodiment, the gate driving circuit shown in FIG. 3 is configured as a bilateral drive as shown in the lower diagram of FIG. 20. That is, a gate driving circuit as shown in FIG. 3 is provided on both sides of the AA area. Corresponding gate driving signals are simultaneously input from both ends of each gate driving line. This not only improves the driving capability of the Nth stage negative pulse gate driving signal Pout[N] and the positive pulse gate driving signal Nout, but also reduces power consumption. It also reduces the space occupied by the frame, which is conducive to the development of narrower frame solutions.

The positive pulse gate driving signal Nout includes the Nth stage positive pulse gate driving signal Nout[N] and the N−Lth stage positive pulse gate driving signal Nout[N−L]. L may be an integer greater than or equal to 1, for example, it may be 2, 3, 4, 5, 6 . . . etc.

In one embodiment, this embodiment provides a display panel. The display panel includes the gate driving circuit and the pixel circuit in at least one of the above embodiments. One row of pixel circuits is electrically connected to the Nth stage positive pulse gate driving line and the Nth stage negative pulse gate driving line.

It can be understood that the display panel provided by this embodiment includes the gate driving circuit in at least one of the above embodiments. It can also be electrically connected to the second node K through the voltage stabilizing module 40. The voltage stabilizing module 40 controls the potential of the fourth node P according to the potential of the second node K, and maintains the potential of the second node K. Therefore, when the clock signal is of low frequency, the potential of the second node K may not decrease due to the influence of leakage. The potential of the second node K can be maintained. Therefore, the gate driving circuit provided in this embodiment can reduce the power consumption of the gate driving circuit by reducing the frequency of the clock signal, and no display abnormality may occur. This further solves the issues in related technologies that lowering the frequency of the clock signal may cause the output of the stage circuit to be abnormal, resulting in display issues on the display panel.

Figure 21:
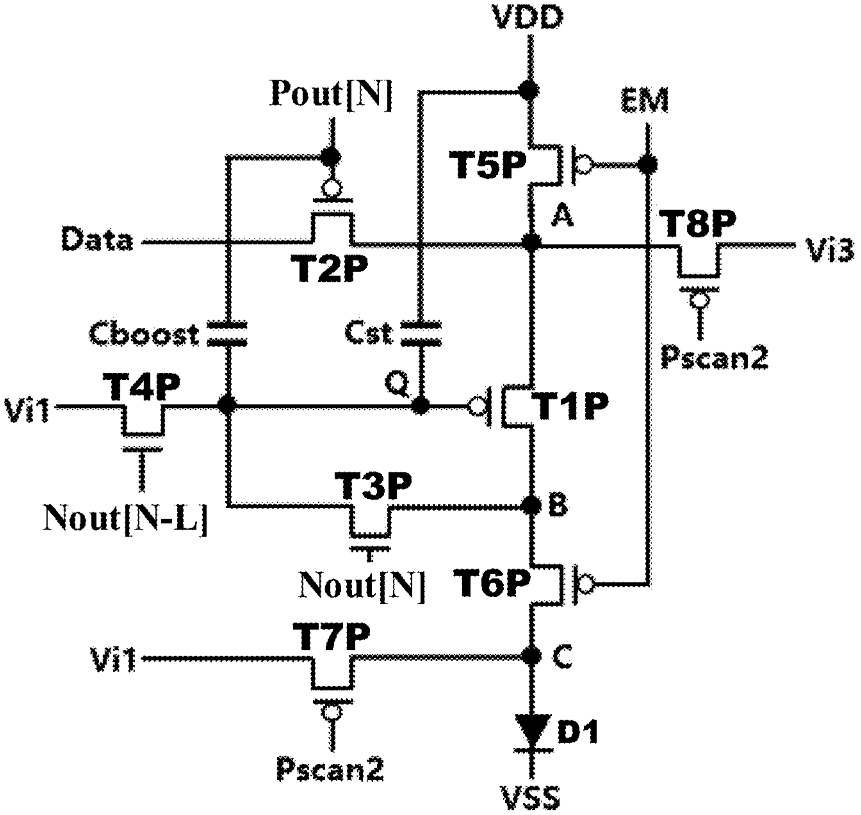
FIG. 21 is a schematic structural diagram of a pixel circuit in the display panel shown in FIG. 20.

FIG. 21 is a schematic structural diagram of the pixel circuit in the display panel shown in FIG. 20. It can be understood that the gate driving circuit shown in FIG. 3 can provide the corresponding Nth stage positive pulse gate driving signal Nout[N], N−Lth stage positive pulse gate driving signal Nout[N−L], and Nth stage negative pulse gate driving signal Pout[N].

The pixel circuit shown in FIG. 21 may include at least one of a writing transistor T2P, a driving transistor T1P, a first light emitting control transistor T5P, a second light emitting control transistor T6P, a first initialization transistor T4P, a second initialization transistor T7P, a third initialization transistor T8P, a compensation transistor T3P, a light emitting device D1, a storage capacitor Cst, and a bootstrap capacitor Cboost.

The first power line is electrically connected to the first electrode of the first light emitting control transistor T5P and one end of the storage capacitor Cst. The second electrode of the first light emitting control transistor T5P is electrically connected to the first electrode of the driving transistor T1P and the first electrode of the writing transistor T2P. The second electrode of the driving transistor T1P is electrically connected to the first electrode of the compensation transistor T3P and the first electrode of the second light emitting control transistor T6P. The second electrode of the second light emitting control transistor T6P is electrically connected to the first electrode of the second initialization transistor T7P and an anode of the light emitting device D1. A cathode of the light emitting device D1 is electrically connected to the second power line. The light emitting control line is electrically connected to the gate of the first light emitting control transistor T5P and the gate of the second light emitting control transistor T6P. The second electrode of the writing transistor T2P is electrically connected to the data line. The gate of the writing transistor T2P is electrically connected to the Nth stage negative pulse gate driving line (first gate driving line) and one end of the bootstrap capacitor Cboost. The second electrode of the second initialization transistor T7P is electrically connected to the second initialization line. The gate of the second initialization transistor T7P is electrically connected to the third gate driving line. The second electrode of the compensation transistor T3P is electrically connected to the gate of the driving transistor T1P. The gate of the compensation transistor T3P is electrically connected to the Nth stage positive pulse gate driving line (second gate driving line). The gate of the driving transistor T1P is electrically connected to the other end of the storage capacitor Cst, the other end of the bootstrap capacitor Cboost and the first electrode of the first initialization transistor T4P. The second electrode of the first initialization transistor T4P is electrically connected to the first initialization line. The gate of the first initialization transistor T4P is electrically connected to the N−Lth stage positive pulse gate driving line (second gate driving line). The first electrode of the third initialization transistor T8P is electrically connected to the first electrode of the driving transistor T1P. The second electrode of the third initialization transistor T8P is electrically connected to the third initialization line. The gate of the third initialization transistor T8P and the gate of the second initialization transistor T7P share the third gate driving line.

It should be noted that the second initialization line can also be replaced by the first initialization line. This can reduce one trace required for the pixel circuit and help increase the density of the pixel circuit in the display panel.

The first electrode may be one of the source or the drain, and the second electrode may be the other of the source or the drain. For example, when the first electrode is the source, the second electrode is the drain. Or, when the first electrode is the drain, the second electrode is the source.

The first power line is used to transmit the positive power signal VDD. The second power line is used to transmit the negative power signal VSS. The potential of the positive power signal VDD is higher than the potential of the negative power signal VSS. The data line is used to transmit the data signal Data. The light emitting control line is used to transmit the light emitting control signal EM. The first initialization line is used to transmit the first initialization signal Vi1. The second initialization line is used to transmit a second initialization signal. The third initialization line is used to transmit the third initialization signal Vi3. The first gate driving line is used to transmit the Nth stage negative pulse gate driving signal Pout[N]. The Nth stage positive pulse gate driving line (second gate driving line) is used to transmit the Nth stage positive pulse gate driving signal Nout[N]. The N−L-th stage positive pulse gate driving line (second gate driving line) is used to transmit the N−L-th stage positive pulse gate driving signal Nout[N−L]. The third gate driving line is used to transmit the gate driving signal Pscan2.

Figure 22:
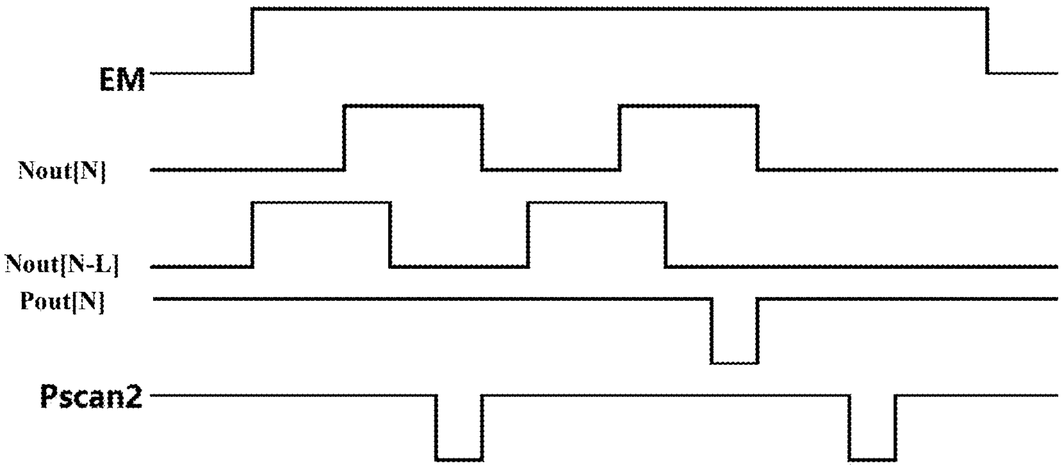
FIG. 22 is a timing diagram of the pixel circuit shown in FIG. 21.

The operation timing of the pixel circuit shown in FIG. 21 in one frame is shown in FIG. 22. Under the common driving of Nth stage negative pulse gate driving signal Pout[N], the gate driving signal Pscan2, the N−Lth stage positive pulse gate driving signal Nout[N−L], the Nth stage positive pulse gate driving signal Nout[N], and the light emitting control signal EM, the pixel circuit shown in FIG. 21 can perform normal display.

The Nth stage negative pulse gate driving signal Pout[N], the N−Lth stage positive pulse gate driving signal Nout[N−L], and the Nth stage positive pulse gate driving signal Nout[N] can be provided by the gate driving circuit shown in FIG. 3.

For those skilled in the art, there may be changes in the specific implementation and application scope based on the ideas of this application. In summary, the contents of this specification should not be construed as limiting this application.

What is claimed is:

1. A gate driving circuit, comprising:

an input subcircuit configured to receive a start control signal and a first clock signal, and control a potential of a second node;

an output subcircuit electrically connected to a third node and a fourth node, and configured to receive a second clock signal different from the first clock signal and output a gate driving signal according to a potential of the third node and a potential of the fourth node; and a voltage stabilizing subcircuit electrically connected to a first power line, a second power line, the second node and the fourth node, and configured to receive the first clock signal and transmit a voltage on the first power line or a voltage on the second power line to the second node according to the first clock signal and the potential of the fourth node in a low power consumption mode of the gate driving circuit.

2. The gate driving circuit according to claim 1, wherein the voltage stabilizing subcircuit comprises a first transistor having a gate configured to receive the first clock signal, and the voltage of the first power line is transmitted to the second node when the first clock signal turns on the first transistor.

3. The gate driving circuit according to claim 2, wherein the first transistor is a dual-gate indium gallium zinc oxide thin film transistor having a first gate and a second gate that are configured to receive the first clock signal.

4. The gate driving circuit according to claim 2, wherein the voltage stabilizing subcircuit further comprises a second transistor, a gate of the second transistor is electrically connected to the fourth node, one of a source and a drain of the second transistor is electrically connected to the first power line, another one of the source and the drain of the second transistor is electrically connected to one of a source and a drain of the first transistor, and another one of the source and the drain of the first transistor is electrically connected to the second node.

5. The gate driving circuit according to claim 4, wherein the voltage on the first power line is transmitted to the one of the source and the drain of the first transistor when the potential of the fourth node turns on the second transistor.

6. The gate driving circuit according to claim 2, wherein the voltage stabilizing subcircuit further comprises a third transistor, one of a source and a drain of the third transistor is electrically connected to the second power line, another one of the source and the drain of the third transistor is electrically connected to the second node, and a gate of the third transistor is electrically connected to the fourth node.

7. The gate driving circuit according to claim 6, wherein the voltage on the second power line is transmitted to the second node when the potential of the fourth node turns on the third transistor.

8. The gate driving circuit according to claim 6, wherein the third transistor is a dual-gate indium gallium zinc oxide thin film transistor having a first gate and a second gate that are electrically connected to the fourth node.

9. The gate driving circuit according to claim 1, further comprising a reset subcircuit configured to control the potential of the second node according to a reset signal.

10. The gate driving circuit according to claim 9, wherein the reset subcircuit comprises a fourth transistor, one of a source and a drain of the fourth transistor is electrically connected to the first power line, another one of the source and the drain of the fourth transistor is electrically connected to the second node, and a gate of the fourth transistor is configured to receive the reset signal.

11. The gate driving circuit according to claim 10, wherein in a first frame of operation of the gate driving circuit, the reset signal turns on the fourth transistor before a pulse of the start control signal, such that the voltage on the first power line is transmitted to the second node.

12. The gate driving circuit according to claim 1, further comprising:

a first driving control subcircuit electrically connected to the second node and the fourth node, and configured to output a potential inverted with the potential of the second node to the fourth node.

13. The gate driving circuit according to claim 12, wherein the first driving control subcircuit comprises:

a fifth transistor, one of a source and a drain of the fifth transistor is electrically connected to the first power line, another one of the source and the drain of the fifth transistor is electrically connected to the fourth node, and a gate of the fifth transistor is electrically connected to the second node; and a sixth transistor, one of a source and a drain of the sixth transistor is electrically connected to a third power line, another one of the source and the drain of the sixth transistor is electrically connected to the fourth node, and a gate of the sixth transistor is electrically connected to the second node, wherein the fifth transistor and the sixth transistor have different channel types.

14. The gate driving circuit according to claim 13, wherein the sixth transistor is a double-gate transistor having a first gate and a second gate that are electrically connected to the second node.

15. The gate driving circuit according to claim 13, wherein a voltage on the third power line is transmitted to the fourth node when the potential of the second node turns on the sixth transistor.

16. The gate driving circuit according to claim 1, further comprising:

a second driving control subcircuit electrically connected between the second node and the third node and having a control terminal electrically connected to a driving control line, wherein the second driving control subcircuit is configured to control a conduction between the second node and the third node.

17. The gate driving circuit according to claim 16, wherein the second driving control subcircuit is configured to eliminate a first pulse at the second node in a frame and retain a second pulse at the second node in the frame.

18. The gate driving circuit according to claim 16, wherein the second driving control subcircuit comprises a transistor, one of a source and a drain of the transistor is electrically connected to an output terminal of the input subcircuit, another one of the source and the drain of the transistor is electrically connected to the third node, and a gate of the transistor is electrically connected to the driving control line, wherein the second node and the third node is conducting when the transistor turns on.

19. The gate driving circuit according to claim 18, wherein the second driving control subcircuit further comprises an anti-leakage transistor, one of a source and a drain of the anti-leakage transistor is electrically connected to the another one of the source and the drain of the transistor, another one of the source and the drain of the anti-leakage transistor is electrically connected to the third node, and a gate of the anti-leakage transistor is electrically connected to an anti-leakage signal line.

20. A display panel comprising a gate driving circuit, wherein the gate driving circuit comprises:

an input subcircuit configured to receive a start control signal and a first clock signal, and control a potential of a second node;

an output subcircuit electrically connected to a third node and a fourth node, and configured to receive a second clock signal different from the first clock signal and output a gate driving signal according to a potential of the third node and a potential of the fourth node; and a voltage stabilizing subcircuit electrically connected to a first power line, a second power line, the second node and the fourth node, and configured to receive the first clock signal and transmit a voltage on the first power line or a voltage on the second power line to the second node according to the first clock signal and the potential of the fourth node in a low power consumption mode of the gate driving circuit.

* * * * *